(12) United States Patent
Mazzola

(10) Patent No.: US 8,193,537 B2
(45) Date of Patent: Jun. 5, 2012

(54) OPTICALLY CONTROLLED SILICON CARBIDE AND RELATED WIDE-BANDGAP TRANSISTORS AND THYRISTORS

(75) Inventor: Michael S. Mazzola, Starkville, MS (US)

(73) Assignee: SS SC IP, LLC, Jackson, MS (US)

( * ) Notice: Subject to any disclaimer, the term of this patent is extended or adjusted under 35 U.S.C. 154(b) by 603 days.

(21) Appl. No.: 11/764,606

(22) Filed: Jun. 18, 2007

(65) Prior Publication Data

US 2007/0292074 A1  Dec. 20, 2007

Related U.S. Application Data

(60) Provisional application No. 60/805,139, filed on Jun. 19, 2006.

(51) Int. Cl.
*H01L 29/15* (2006.01)
*H01L 31/0312* (2006.01)

(52) U.S. Cl. ............ 257/77; 257/194; 257/103; 257/78; 257/256; 257/195; 438/403; 438/917; 438/931; 117/951

(58) Field of Classification Search ............ 257/77, 257/194, 103, 78, 256, 195; 438/403, 917, 438/931; 117/951
See application file for complete search history.

(56) References Cited

U.S. PATENT DOCUMENTS

| | | | |
|---|---|---|---|
| 3,946,151 A | 3/1976 | Kamiyama | |
| 4,207,583 A | 6/1980 | Temple | |
| 4,465,750 A | 8/1984 | Ogawa et al. | |
| 4,825,061 A | 4/1989 | Schoenbach et al. | |
| 5,864,166 A | 1/1999 | Stoudt et al. | |
| 6,046,466 A | 4/2000 | Ishida et al. | |
| 6,191,458 B1 | 2/2001 | Brown et al. | |
| 6,437,538 B1 | 8/2002 | Tsurumi et al. | |
| 6,767,783 B2 | 7/2004 | Casady et al. | |
| 7,009,209 B2 | 3/2006 | Casady et al. | |
| 2002/0096684 A1 | 7/2002 | Brandes et al. | |
| 2002/0149021 A1 | 10/2002 | Casady et al. | |
| 2005/0051861 A1 | 3/2005 | Shi et al. | |
| 2005/0233091 A1* | 10/2005 | Kumar et al. | 427/569 |
| 2006/0062897 A1* | 3/2006 | Gu et al. | 427/8 |

(Continued)

FOREIGN PATENT DOCUMENTS

JP  56025743 A  3/1981

(Continued)

OTHER PUBLICATIONS

International Search Report from PCT/US2007/071543, dated Mar. 28, 2008.

(Continued)

*Primary Examiner* — Telly Green
(74) *Attorney, Agent, or Firm* — Morris, Manning & Martin, LLP; Christopher W. Raimund

(57) ABSTRACT

An optically active material is used to create power devices and circuits having significant performance advantages over conventional methods for affecting optical control of power electronics devices and circuits. A silicon-carbide optically active material is formed by compensating shallow donors with the boron related D-center. The resulting material can be n-type or p-type but it is distinguished from other materials by the ability to induce persistent photoconductivity in it when illuminated by electromagnetic radiation with a photon energy in excess of the threshold energy required to photo-excite electrons from the D-center to allowed states close to the conduction band edge, which varies from polytype to polytype.

20 Claims, 16 Drawing Sheets

U.S. PATENT DOCUMENTS

| | | | | |
|---|---|---|---|---|
| 2006/0078675 | A1* | 4/2006 | Kumar et al. | 427/248.1 |
| 2006/0102908 | A1* | 5/2006 | Imai et al. | 257/77 |
| 2006/0228497 | A1* | 10/2006 | Kumar et al. | 427/571 |
| 2006/0228897 | A1* | 10/2006 | Timans | 438/758 |
| 2007/0029573 | A1 | 2/2007 | Cheng et al. | |

FOREIGN PATENT DOCUMENTS

| | | |
|---|---|---|
| JP | 2006080560 A | 3/2006 |
| WO | 2004114422 A1 | 12/2004 |

OTHER PUBLICATIONS

Blanc, J., et al., "Properties of High-Resistivity Gallium Arsenide Compensated with Diffused Copper," Journal of Applied Physics, vol. 32, No. 9, pp. 1666-1679, 1961.

Buttram, M., "Chapter 1: Introduction," High-Power Optically Activated Solid-State Switches, eds. A. Rosen and F. Zutavern. Artech House, Norwood, Massachusetts, 1994, p. 2.

Cheng, L., et al., "Fast Switching (41 MHz), m omega•cm2, High Current 4H-SiC VJFETs for High Power and High Temperature Applications," Presented at Inter. Conf. Silicon Carbide and Related Mat. (ICSCRM), Pittsburgh, Pennsylvania, 2005.

Das, H., et al., "The Creation of Boron Deep Levels by High Temperature Annealing of 4H-SiC," Thesis, Master of Science in Electrical Engineering, Mississippi State University, pp. 45-46, 2004.

Hudgins, J., et al., "Chapter 3: Thyristors," Power Electronics Handbook, ed. M.H. Rashid, Academic Press, San Diego, CA, 2001, p. 44.

Jenny, J.R., et al., "Optical and Electrical Characterization of Boron Impurities in Silicon Carbide Grown by Physical Vapor Transport," J. Appl. Phys., vol. 79, pp. 2326-2331, 1996.

Krein, P., "Chapter 1: Introduction," Power Electronics Handbook, ed. M.H. Rashid, Academic Press, San Diego, CA, 2001, pp. 7-8.

Krein, P., "Chapter 1: Introduction," Power Electronics Handbook, ed. M. FL Rashid, Academic Press, San Diego, CA, 2001, p. 10.

Mazzola, M.S., et al., "GaAs Photoconductive Closing Switches with High Dark Resistance and Microsecond Conductivity Decay," Appl. Phys. Lett., vol. 54, pp. 742-744, 1989.

Mazzola, M.S., et al., "Nanosecond Optical Quenching of Photoconductivity in a Bulk GaAs Switch," Appl. Phys. Lett., vol. 55, pp. 2102-2104, 1989.

Mazzola, M.S., et al., "Infrared Quenching of Conductivity at High Electric Fields in a Bulk, Copper-Compensated, Optically Activated GaAs Switch," IEEE Trans. Electron Dev., vol. 37, No. 12, pp. 2499-2505, 1990.

Mazzola, M.S., et al., "Analysis of Nonohmic Current-Voltage Characteristics in a Cu-Compensated GaAs Photoconductor," Applied Physics Letters, vol. 59, No. 10, pp. 1182-1184, 1991.

Mazzola, M.S., et al., "Observation of the D-Center in 6H-SiC p-n Diodes Grown by Chemical Vapor Deposition," Appl. Phys. Lett., vol. 64, No. 20, pp. 2370-2372, 1994.

Pocha, M.D., et al., "Chapter 3: High-Speed Switching in Photoconductors," High-Power Optically Activated Solid-State Switches, eds. A. Rosen and F. Zutavern. Artech House, Norwood, Massachusetts, 1994, p. 48.

Roush, R.A., et al., "Compensation of Shallow Silicon Donors by Deep Copper Acceptors in Gallium Arsenide," Applied Physics Letters, vol. 62, No. 21, pp. 2670-2672, 1993.

Saddow, S.E., et al., "Hole Capture by D-Center Defects in 6H-Silicon Carbide," Journal of Applied Physics, vol. 77, No. 1, pp. 318-322, 1995.

Saura, J., et al., "Laser-Quenching of Photoconductivity and Recombination Processes in Sensitive Photoconductors," Journal of Applied Physics, vol. 36, No. 11, pp. 3660-3662, 1965.

Schoenbach, K.H., "Chapter 6: Optically Activated Opening of Copper-Doped Gallium Arsenide Switches," High-Power Optically Activated Solid-State Switches, eds. A. Rosen and F. Zutavern. Artech House, Norwood, Massachusetts, 1994, p. 95.

Stoudt, D.C., et al., "Investigation of a Laser-Controlled, Copper-Doped GaAs Closing and Opening Switch for Pulsed Power Applications," Proc. IEEE Pulsed Power Conf., pp. 41-44, 1991.

Suttrop, W., et al., "Boron-Related Deep Centers in 6H-SiC," Appl. Phys. A, vol. 51, pp. 231-237, 1990.

Wilson, J., et al., "Optoelectronics: An Introduction," Prentice-Hall International, London, 1983, pp. 323-324.

Zutavern, F., et al., "Chapter 11: High-Voltage Lateral Switches from Silicon or Gallium Arsenide," High-Power Optically Activated Solid-State Switches, eds. A. Rosen and F. Zutavern. Artech House, Norwood, Massachusetts, 1994, pp. 247-251.

* cited by examiner

OPTICALLY CONTROLLED SILICON CARBIDE AND RELATED WIDE-BANDGAP TRANSISTORS AND THYRISTORS

CROSS REFERENCE TO RELATED APPLICATIONS

This application is based on, and claims priority to, U.S. Provisional Application Ser. No. 60/805,139, filed Jun. 19, 2006, the entire contents of which are hereby incorporated by reference.

BACKGROUND

1. Field

This invention relates to advanced microelectronic (semiconductor) devices and methods for fabricating the same, and in particular, to microelectronic devices containing a region of optically active material that permits the device to be closed with a pulse of light of one wavelength; and then opened with a pulse of light of a second wavelength.

2. Background of the Technology

The circuit shown in FIG. 1 is widely used in diverse applications where the conversion of one voltage or current (usually DC) to a three phase AC voltage or current (or vice versa) is required [1]. Examples include motor drives for electric vehicles, industrial motors used in factories, and utility power conditioning systems such a static volt-ampere-reactive (SVAR) compensators and rectifiers and invertors used for high-voltage DC electric power transmission, two-switch and four-switch versions of this circuit (the "half bridge" and the "full bridge," respectively) are common in power supply applications used throughout the defense and civilian electronics industry.

The circuit has six semiconductor switches that can be constructed in many forms, including the bipolar junction transistor (BJT), the metal-oxide-semiconductor field effect transistor (MOSFET), the insulated gate bipolar transistor (IGBT), the static induction transistor (SIT), thyristors of the silicon controlled rectifier (SCR) type, the gate-turn-off (GTO) type, or the static induction type [2]. Many other variations of the above can be found in the prior art.

The basic circuit building block found in FIG. 1 is the two-switch half-bridge phase leg (see FIG. 2). FIG. 2 also shows two disadvantages of this prior art. The first is commonly known as the "high-side gate driver" problem in which the upper switch S1 is electrically controlled by gate driver circuitry whose common connection is the load, and thus a floating gate drive is required. This introduces greater complexity and cost into the final system. The second problem is the possible introduction of incorrect gate signals which could cause improper operation of the half-bridge, possibly causing a failure to occur in either the circuit or the load. The source of these incorrect gate signals is commonly called "electromagnetic interference" or EMI. EMI can come from many sources and can effect all applications. But in military related systems, there is the additional threat of intentionally introduced EMI from enemy action. EMI can effect the operation of any and all switches in the circuit, including the low-side switch S2 in FIG. 2.

Optically controlled circuits represent one remedy to both the high-side gate driver problem and the EMI problem. FIG. 3 illustrates another embodiment of the prior art that partially remedies the problem. The introduction of an additional circuit in the gate driver is called an optical receiver that allows a fiber optic connection between a central processor and any of the switches in the circuit of FIG. 3. The fiber optic link is generally much less vulnerable to EMI, if not immune. Unfortunately, the problem of providing isolated electrical power to the receiver and the gate driver remains. And the gate driver circuitry is still potentially vulnerable to EMI. The former problem is especially troublesome whenever a long string of devices are connected in series to multiply the total blocking voltage of the stack, as is often the case in electric utility equipment.

A typical response is to eliminate, if possible, the gate driver circuitry all together. The use of optically active switches is one solution. FIG. 4 reveals additional prior art in which optically active devices, usually optically triggered thyristors, are used because they do not need a gate driver to be switched on or "closed." Generally, optical radiation of a characteristic wavelength generated by a laser (but other sources of optical energy can be used) is conducted by suitable means (usually fiber optic cable) to the switch. Electron-hole pairs are generated in the portion of the switch that is illuminated such that the device switches into conduction [3]. The principal limitation is that the switch cannot usually be switched off with light, which accounts for the popularity of thyristors because they can generally be switched off by the external circuit through a process known as commutation. This limits the optically triggered thyristor, by far the most commonly used optically active switch used in power electronics, to applications where circuit commutation is possible; however, in many applications commutation is not an option which severely limits the application of the prior art in optically active switches.

Optically active BJTs, also known as phototransistors, are commonly used in the microelectronics industry in devices such as "optical isolators" (or "opto-isolators" for short) and light detectors of various kinds and applications. Phototransistors are rarely used in circuits like FIG. 1, but in principal they could be. Phototransistors of the prior art are a variation on the optically triggered thyristor in that electron-hole pairs are generated by a light source with a photon energy that exceeds the bandgap energy of the semiconductor used in the transistor. The base of the BJT is usually chosen to be the optically active medium. An advantage of the optically active BJT is that conduction through the transistor will continue only for as long as the light shines on the base of the BJT. When the light is removed, the BJT will stop conducting current and in due course the switch will turn off or "open." The problem is that the delay prior to switch off is generally determined by the physics of minority carrier storage in the base of the BJT which is generally slow for BJTs that have good optical gain [4]. The phototransistor can be made faster by introducing impurities that result in a short minority carrier lifetime (MCL) but this negatively impacts the optical gain. In most applications, the optical energy required to initiate and sustain conduction is an important figure of merit, where less is much better.

Similar problems arise in the development of semiconductor switches intended to control large amounts of transient power, known as pulsed power generators. These systems are generally found in defense and medical applications. Very fast switching is demanded by such applications [5], which has made semiconductor device development by the pulsed power technical community rather distinct from that developed for applications in the conventional power electronics community. In the pulsed power community switches that close when illuminated by laser light and then open when the laser light is removed with a time constant characteristic of the material are said to operate in the "linear mode" [6]. Linear-mode switches can be characterized as "light-sustained" bulk photoconductive closing and opening switches.

Such switches are similar in this respect to the phototransistor except that they are simpler in construction, often consisting of little more than a block of semiconductor, such as silicon or gallium arsenide, with a metal contact on either end to form Ohmic contacts for connecting the switch to the external circuit; and their size is typically much larger which reflects their completely different application [7]. However, the disadvantageous trade-off in laser energy for switching speed remains the same [8].

An alternative to the "light sustained" photoconductive switch is taught by Schoenbach et al. in U.S. Pat. No. 4,825,061 [9], which reveals a bulk photoconductive device in which a laser pulse of one wavelength stimulates persistent photoconductivity which continues for up to many microseconds after the laser pulse of nanosecond duration has terminated [10]; and which can be terminated on demand by application of a second "quenching" laser pulse of longer wavelength [11]. Schoenbach et al. in '061 takes advantage of the optical quenching effect which was known by 1960 to be particularly strong in Gallium Arsenide doped with copper [12]. The physics of infrared optical quenching in photosensitive semiconductors like copper-doped GaAs and CdS, the fundamental basis of '061, were adequately understood by 1965 [13]. The teaching of Schoenbach et al. in '061 is limited to the use of these effects in a bulk photoconductive switch whose embodiment is described generally in [7] and [9] and is illustrated in FIG. 5. A substantial literature, e.g. [14] and [15], reveals that the teaching can be practically realized by a photoconductive switch intended for circuits like that shown in FIG. 6 and that are generally utilized in pulsed power applications, for example, as taught by Stoudt et al. in U.S. Pat. No. 5,864,166 [16]. All demonstrations of practical working devices have been limited to the bulk photoconductive switch taught by Schoenbach et al. in '061 and fabricated with the same core process of compensating silicon-doped GaAs with copper (GaAs:Si:Cu) by thermal diffusion to make a bulk semi-insulating material [17]. Indeed, no other practical teaching is contained in '061.

The advantage of the GaAs:Si:Cu photoconductive switch, as compared to the pulsed power switching prior art, is that it has high photoconductive gain in a material with short minority carrier lifetime, thus offering a much lower consumption of laser power to applications requiring current pulses with fast rise and fall times and a long and/or continuously variable duty ratio. However, as reported in [14] only relatively low average electric fields of the order of 3 kV/cm can be controlled in GaAs:Si:Cu bulk photoconductive switches because of a fundamental instability that leads to current filamentation [18], so to block large voltages and to conduct large currents, an extremely large active area is required with respect to the conventional semiconductor devices used in the power electronics industry. Therefore, prohibitively large laser energy is required to apply the switch to power electronics applications. An additional disadvantage is that GaAs is generally a poor choice for power electronics due, among other reasons, to its low thermal conductivity. Schoenbach et al. does not teach an embodiment that can be practically applied to a better choice of semiconductor for power electronics, such as silicon carbide.

SUMMARY

In one aspect, the boron-related D-center is used to compensate shallow donors in silicon carbide to produce an optically active material capable of exhibiting persistent photoconductivity induced by optical radiation in the yellow or green portion of the electromagnetic spectrum, and optical quenching of the same persistent photoconductivity with optical radiation of longer wavelength in the near infrared to red portion of the electromagnetic spectrum. All of the important polytypes of SiC are rendered with essentially the same properties by compensating shallow donors with the boron-related D-center, including but not limited to 3C, 4H, and 6H.

In various embodiments, the optically active material formed by D-center compensated SiC is incorporated into the appropriate active regions of a variety of microelectronic devices used in power electronics applications by selective means. These means include implantation of boron into silicon carbide substrate material and/or epitaxial material followed by the diffusion of boron resulting in the creation of D-centers in one-, two-, and three-dimensional device structures via high-temperature thermal treatment or via continued epitaxial growth.

In one embodiment, the optically active material formed by D-center compensated SiC is incorporated in the base of an optically controllable bipolar junction transistor (BJT).

In another embodiment, the optically active material formed by D-center compensated SiC is incorporated into the channel of optically controllable vertical and lateral channel junction field effect transistors (JFETs).

In yet another embodiment, the optically active material formed by D-center compensated SiC is incorporated into the channel of an optically controllable metal-oxide-semiconductor field effect transistor (MOSFET).

In yet another embodiment, the optically active material formed by D-center compensated SiC is incorporated into the p-base of an optically controllable thyristor.

In still another embodiment, the optically active material formed by the D-center compensated SiC is incorporated into the channels formed in the p-base of an optically controllable static induction thyristor (also known as a field controlled thyristor).

The microelectronic devices discussed above, as well as other configurations apparent to others skilled in the art upon examination of these teachings, can be incorporated into power electronics systems with the advantages of permitting pure optical control of both the closing and opening transitions of the switches with virtually infinite combinations of duty ratios of the closing and opening periods ranging from milliseconds for a single closing optical impulse to much longer if a regular sequence of closing optical impulses illuminate the device active area so as to replenish the persistent photoconductivity.

Additional advantages and features will be set forth in part in the detailed description that follows and in part will become more apparent to those skilled in the art upon examination of the following or upon learning of the practice of the invention.

DETAILED DESCRIPTION

Figure 1:
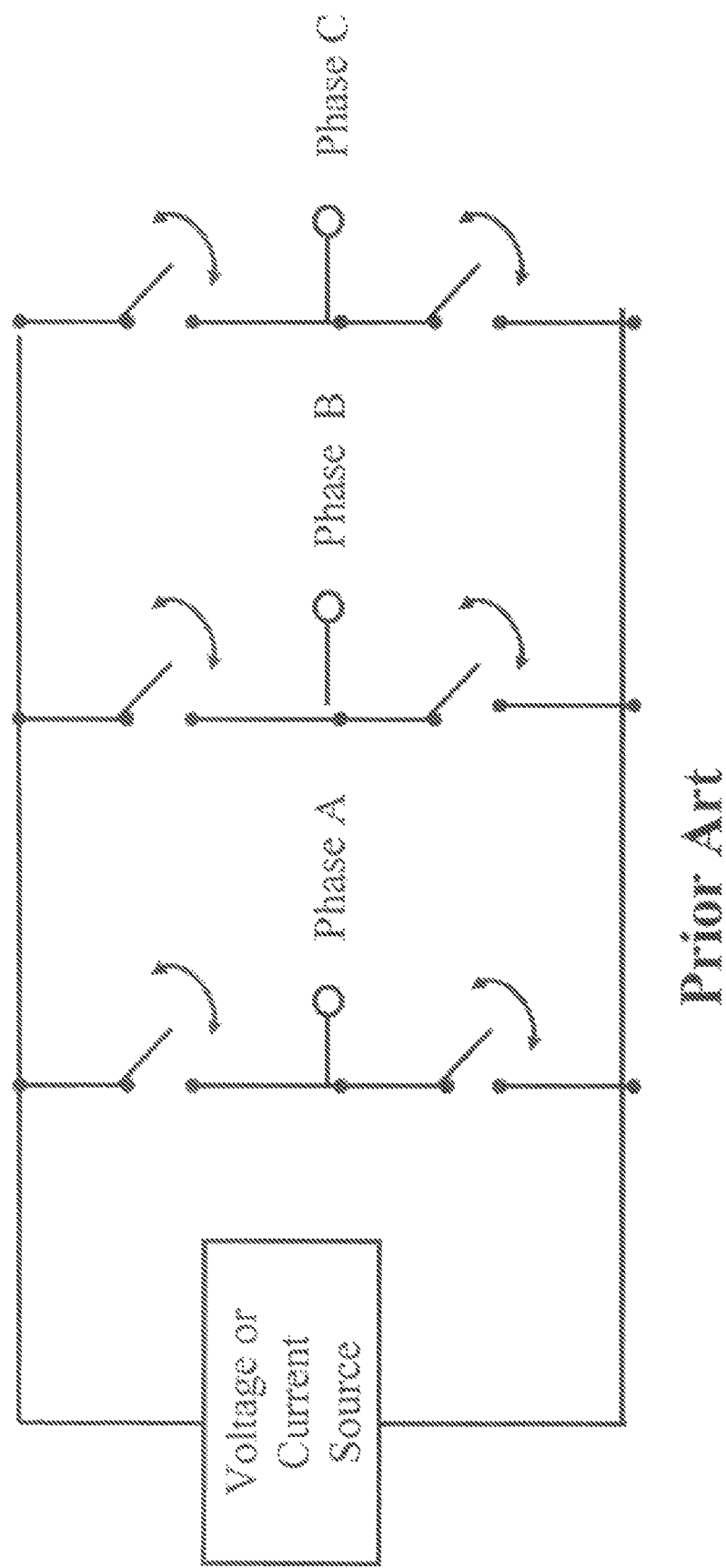
FIG. 1 is a general illustration of the prior art in three-phase motor drives.
Figure 2:
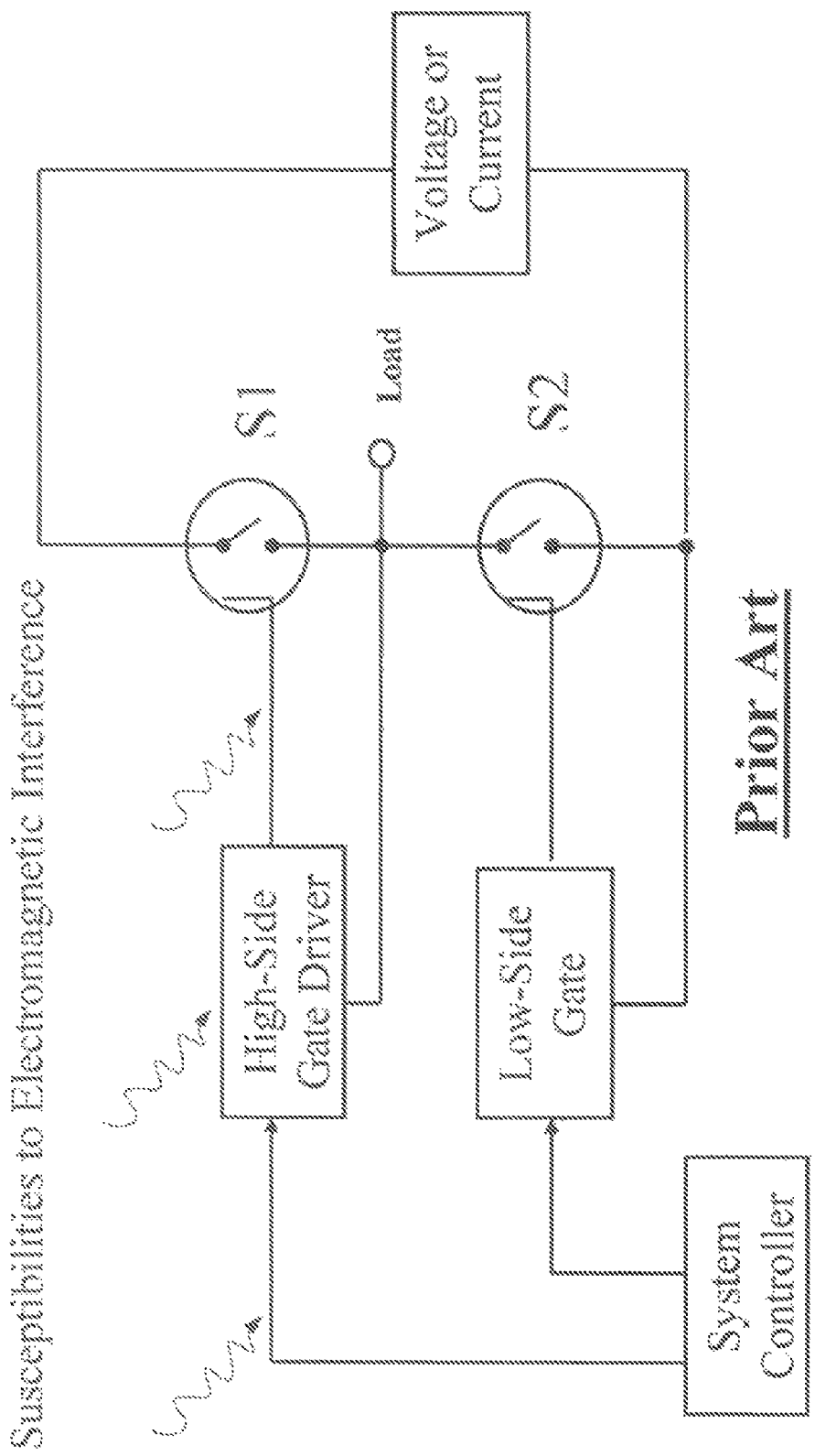
FIG. 2 is an illustration of the prior art in conventional half-bridge circuits employing electrically controlled gate drivers and electrically controlled switches.
Figure 3:
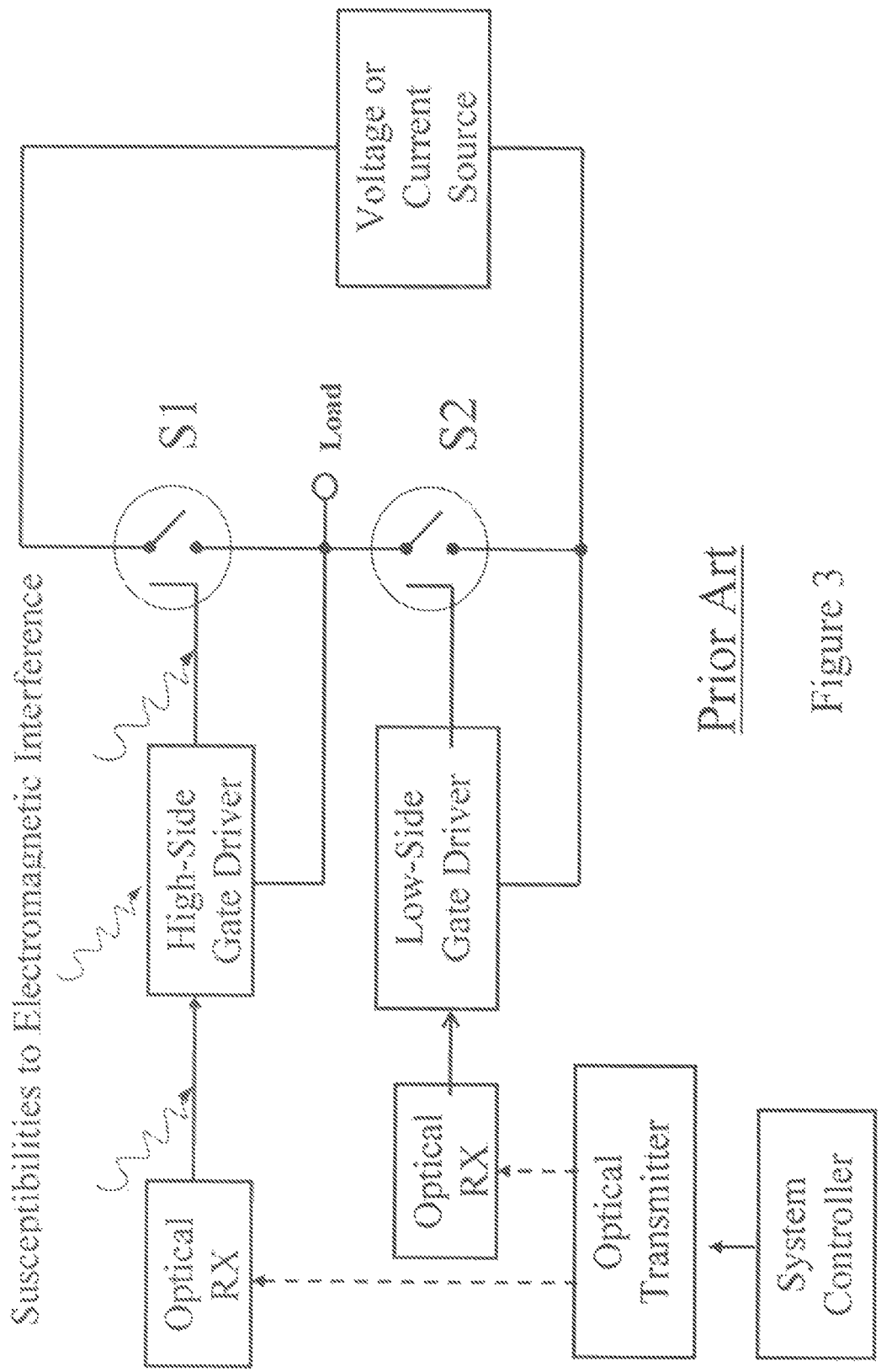
FIG. 3 is an illustration of the prior art in conventional half-bridge circuits employing optically controlled gate drivers and electrically controlled switches.
Figure 4:
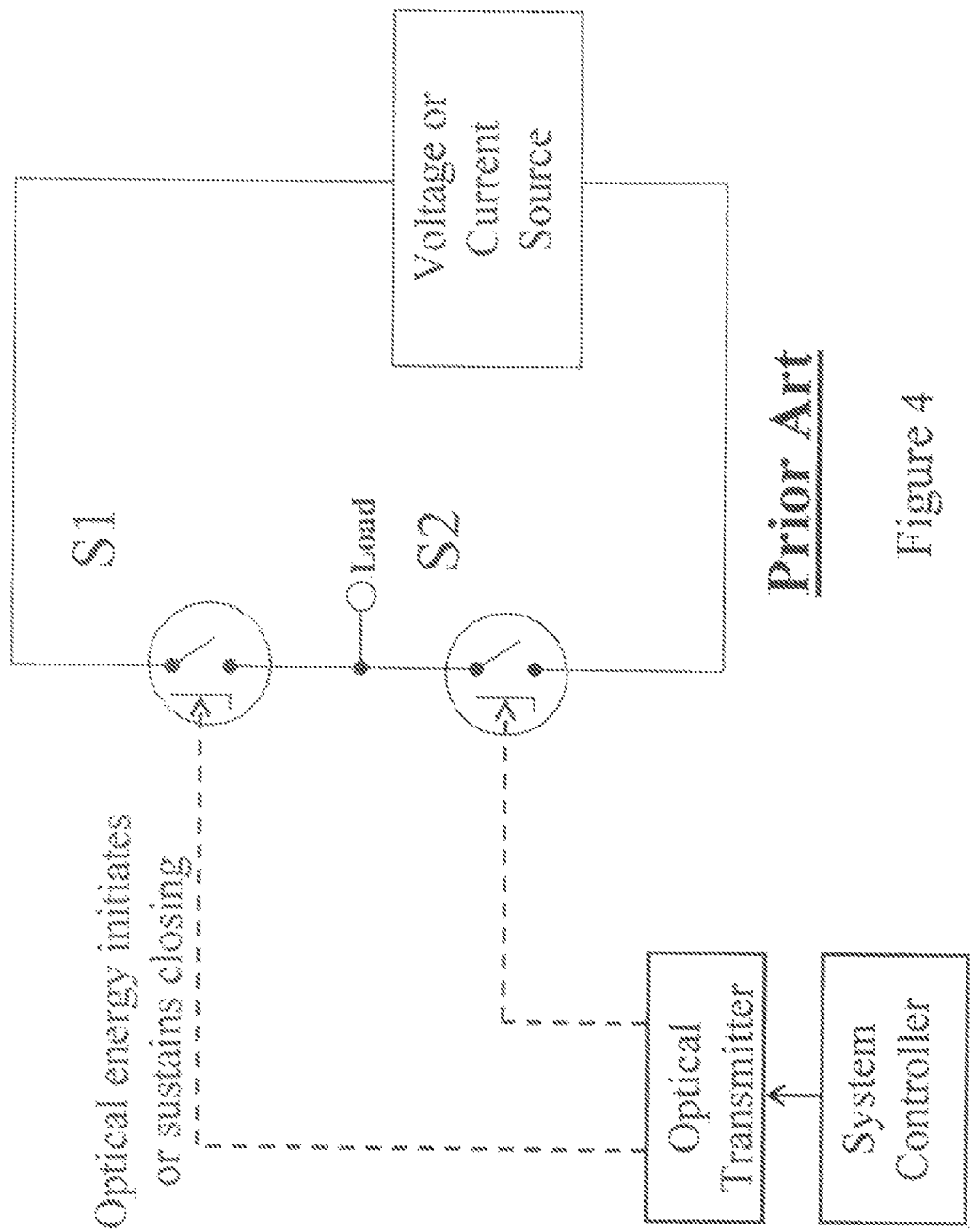
FIG. 4 is an illustration of the prior art in optically controlled half-bridge circuits employing optically stimulated or sustained switches.
Figure 5:
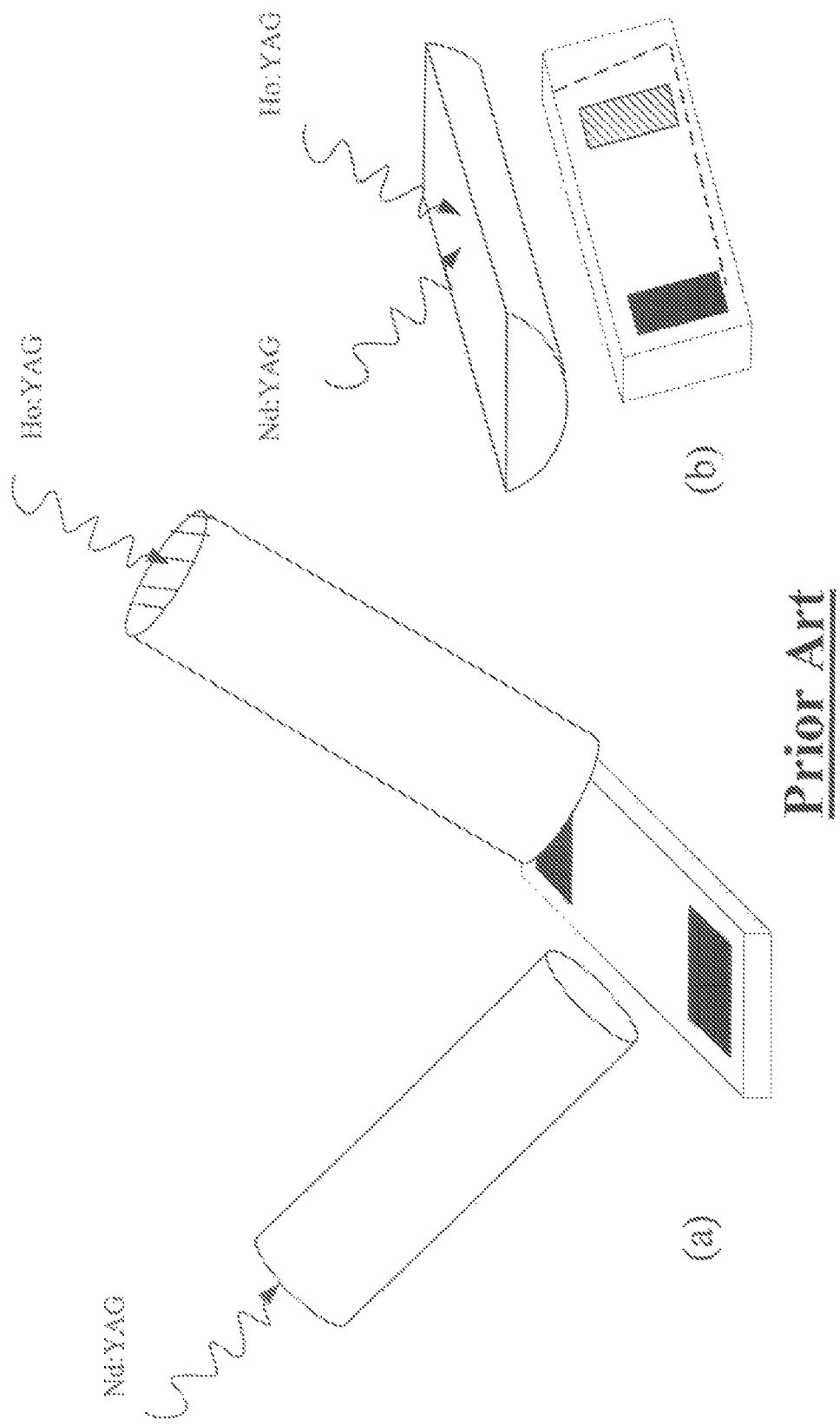
FIG. 5 is an illustration of the prior art in GaAs:Cu:Si photoconductive switches (after Ref. [15]).
Figure 6:
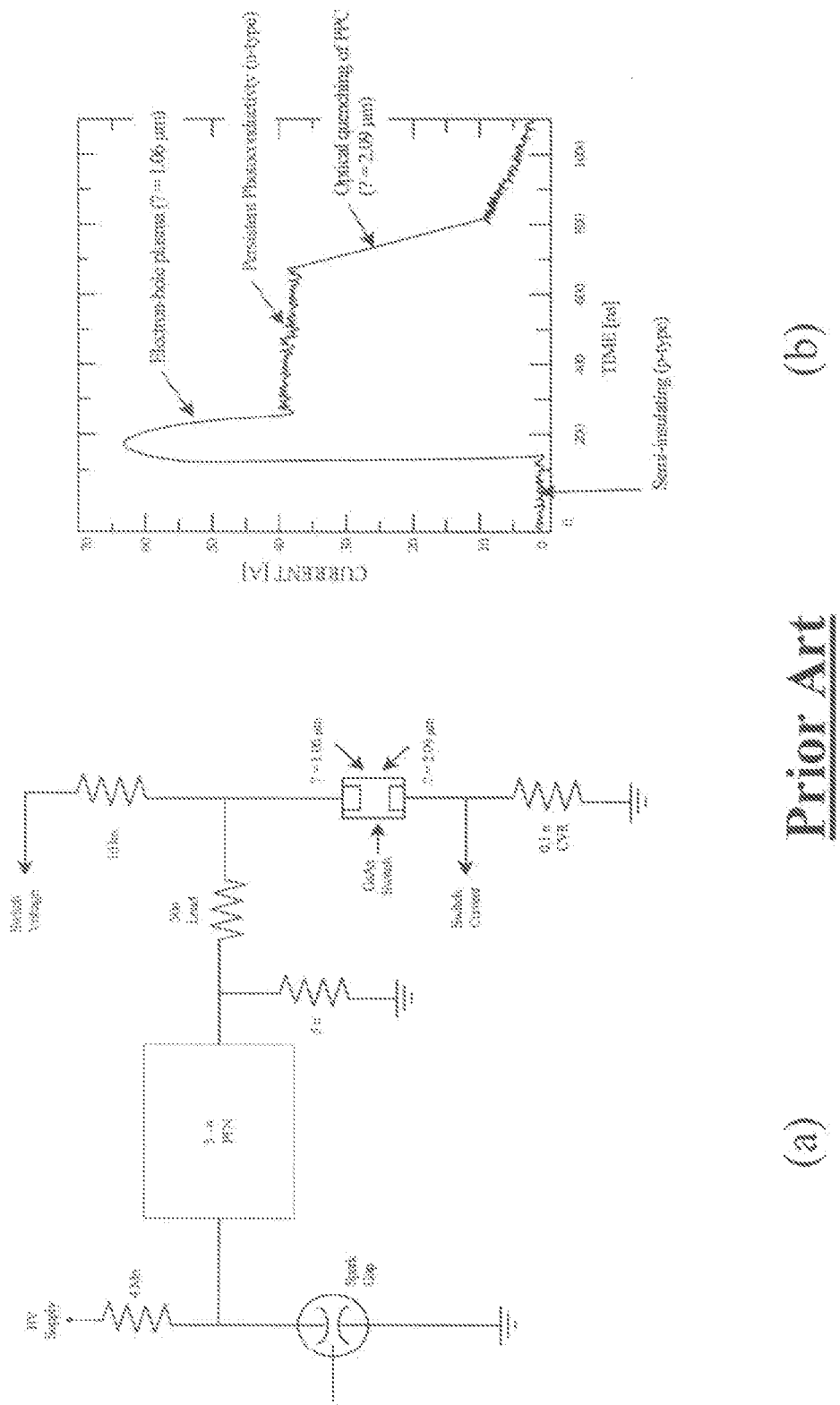
FIG. 6 is an illustration of the application and results of using the prior art in GaAs:Cu:Si photoconductive switches in a pulsed power circuit (after Ref. [15]).

The present invention provides for a silicon carbide optically active material used to create an entire class of power devices and integrated circuits with significant advantages in circuits requiring or benefiting from control by pure optical gating. An example of one such application is the circuit 1 shown in FIG. 7. The circuit is a half-bridge power circuit containing two transistor switches 2, one in the "high side" position and one in the "low side" position. A controller 3 drives a source of electromagnetic radiation 4 which can produce beams of electromagnetic radiation of one wavelength 5 and of a second wavelength 6 such that the first wavelength is less than the second wavelength. Both the high-side and the low-side switches can be illuminated with either of the beams in arbitrary sequences as determined by the controller. Such half-bridge circuits would have application by themselves in various electrical power supplies, or as output stages in integrated circuits. Or two of them could be connected together to form full-bridge circuits (not shown). Or three of them could be connected together to form three-phase circuits as illustrated in FIG. 1. Or other interconnections of these circuits could become apparent to those skilled in the art upon examination of the following or upon learning by practice of the invention.

The optically active material in some embodiments is based on silicon carbide semiconductor from any of the known polytypes, the most common of which are 4H—SiC and 6H—SiC. However, 3C—SiC, 15R—SiC, as well as others will work equally well. Silicon carbide is a class of semiconductors with wide bandgaps. For example, 4H—SiC has a bandgap of about 3.2 eV at T=300 K, while 6H—SiC has a bandgap of about 2.9 eV at T=300 K. SiC is also an indirect bandgap semiconductor. The wide bandgap permits high-voltage and high-temperature operation at characteristically low specific on-resistance as compared to narrow bandgap semiconductors such as silicon or gallium arsenide. Also, SiC of any polytype has an advantageously large thermal conductivity (at least six times that of GaAs). Thus, the use of SiC devices is growing in applications requiring power semiconductor devices, such as the important power electronics industry.

Figure 8:
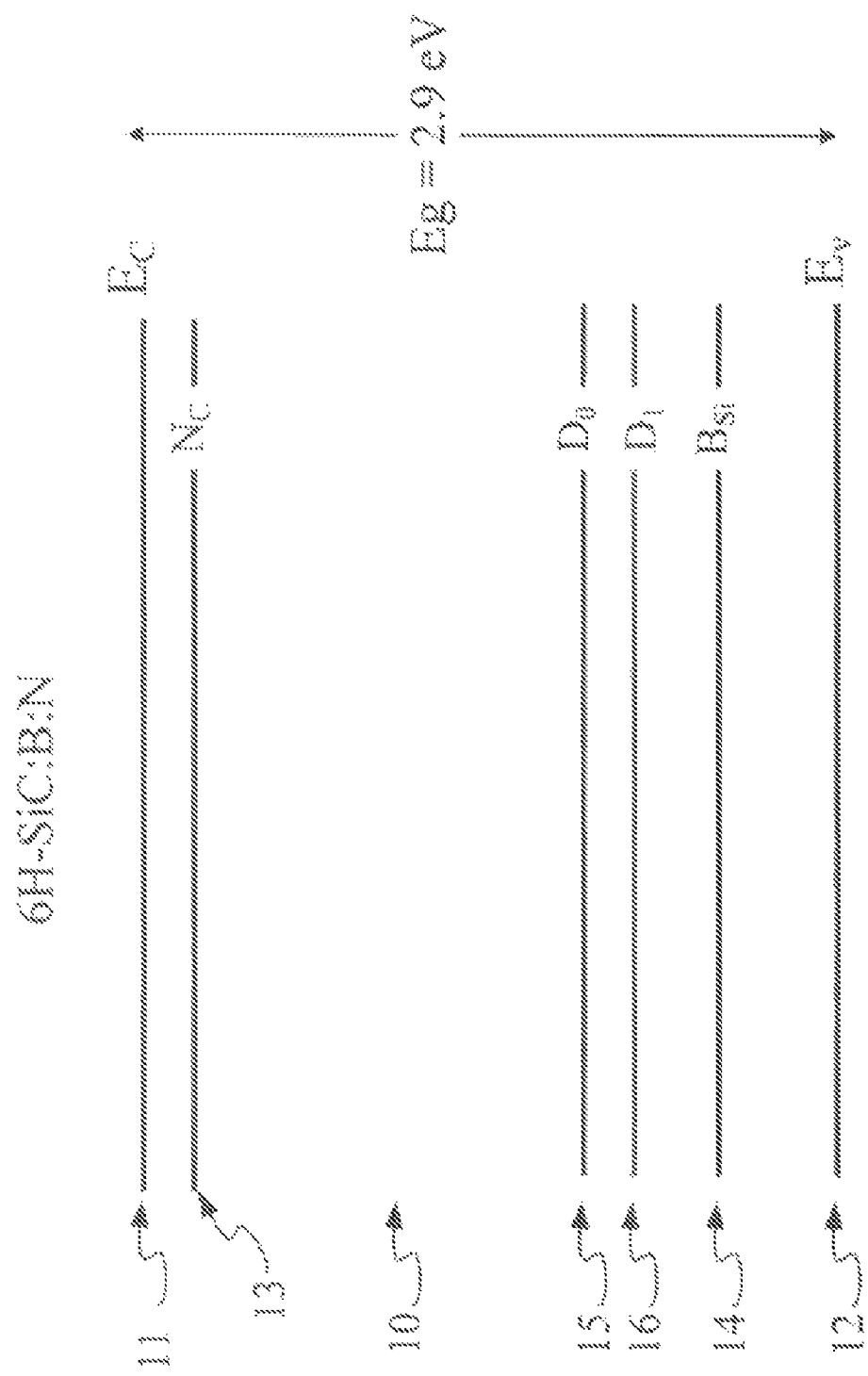
FIG. 8 is an illustration of the bandgap of the optically active material consisting of the 6H polytype of the silicon carbide semiconductor doped with shallow nitrogen donors and compensated with boron acceptors and boron-related D-centers (6H—SiC:B:N) and contained in one or more embodiments of the present invention.

Specifically, the optically active material is SiC doped with shallow donors, such as nitrogen or phosphorus, and compensated with boron acceptors and boron-related D-centers. A diagram of the bandgap 10 of an example of this material in 6H SiC is shown in FIG. 8. 6H—SiC has a conduction band 11 separated from the valence band 12 by an energy of 2.9 eV. The 6H—SiC material is doped during growth by nitrogen, which forms shallow donor levels 13 averaging 0.1 eV below the conduction band. Either during growth, or most likely afterward, boron is introduced into the 6H-1-SiC. Boron forms two distinct types of impurity centers in SiC. The first is the boron acceptor 14 at about 0.3 eV above the valence band which is formed when a boron impurity atom substitutes onto a silicon vacancy site. The second is the D-center which forms when a boron atom substitutes onto a silicon vacancy site that is part of a larger complex of native point defects, such as the so-called carbon vacancy $V_C$. The D-center is definitely deeper in the bandgap than is the boron acceptor and any particular SiC polytype can contain concentrations of both boron acceptors and D-centers. The D-center has been well studied both with optical spectroscopic means and by thermal spectroscopic means. The result is reported as an optical activation energy of 0.73 eV above the valence band and a thermal activation energy ranging from 0.58 to 0.63 eV above the valence band [19]. FIG. 8 illustrates one resolution of this discrepancy by use of the two-level model found in Ref. [19] in which a D-center ground state 15 is located at 0.73 eV above the valence band while a second excited state of the D-center 16 is located at about 0.58 eV above the valence band. The observed difference between the optical and thermal activation energies associated with electron and hole capture at the D-center are predicted by this model. The material can be optically active when either shallow donor states outnumber the sum of the boron and D-center acceptor states (leaving the material n-type when in thermal equilibrium), or when the opposite is true (leaving the material p-type when in thermal equilibrium).

Figure 9:
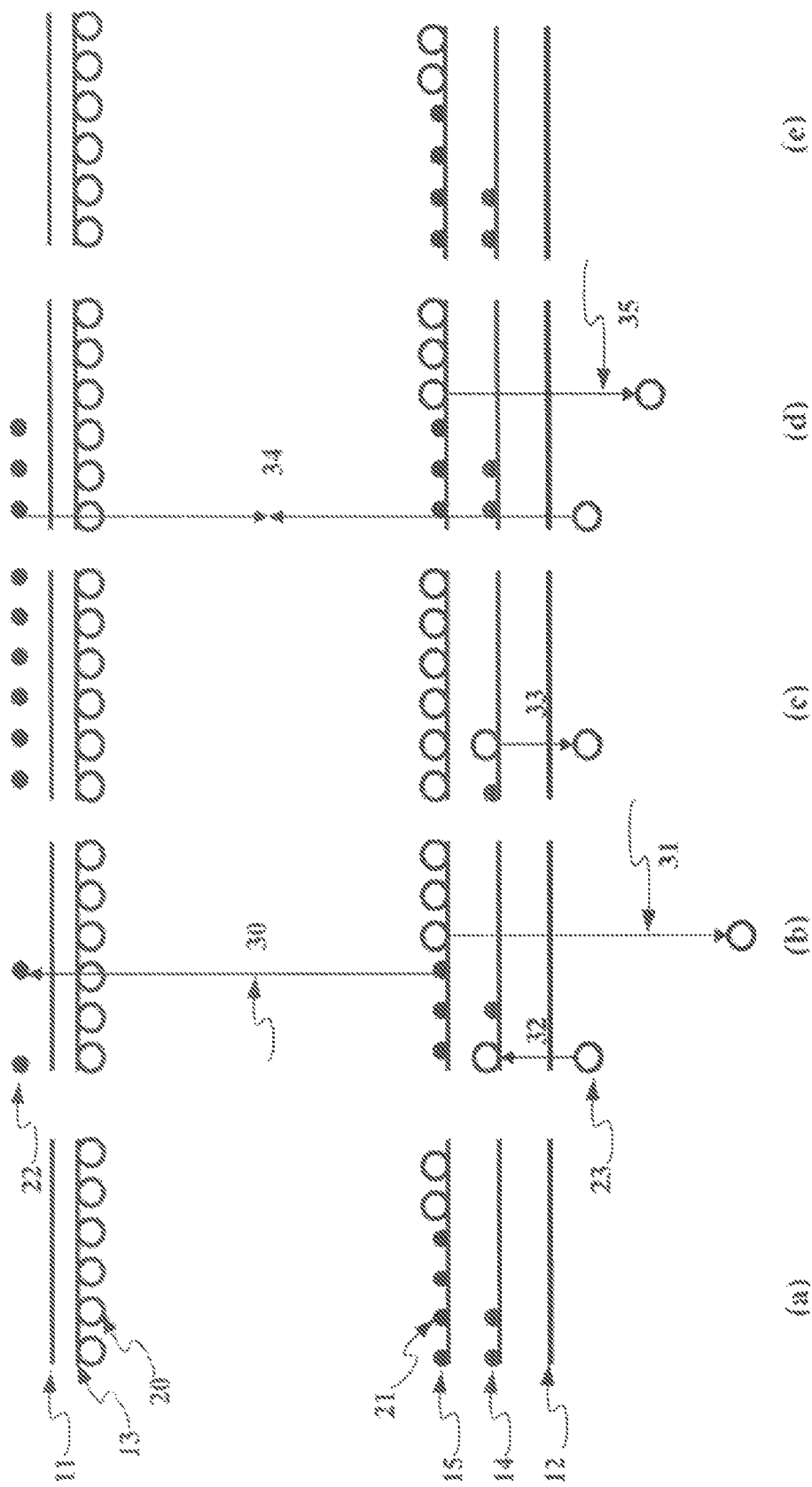
FIG. 9 is an illustration of the cycle of photoconductivity possible in an optically active material made from SiC:B:N compensated with D-centers when pulses of electromagnetic radiation of two different wavelengths consecutively illuminate the optically active region of one or more embodiments of the present invention.

FIG. 9 illustrates the cycle of photoconductivity that can be excited by optically active SiC:B:N material. FIG. 9 (a) shows the equilibrium p-type material in its highly resistive state in which little or no conductivity is observed. Virtually all of the nitrogen donor states are positively charged and thus contain a trapped hole 20. Virtually all of the boron acceptor states and many of the D-center states are negatively charged and thus contain a trapped electron 21. The remaining neutral D-center states contain a trapped hole 20.

FIG. 9 (b) shows the material when illuminated by electromagnetic energy with wavelength less than 580 nm. Photons with this energy (>2.14 eV) will excite process 30 in which electrons are photoionized from the D-center ground state 15, leaving a free electron 22 and a trapped hole in the neutral D-center. As long as the wavelength exceeds 500 nm, there will be not be electron photoionization of the boron acceptor. Photons with this energy will also excite process 31 in which trapped holes are photoionized from the D-center ground state leaving a free hole 23 and a trapped electron in the negatively charged D-center. Because both the B-acceptor and the D-center have relatively large hole capture cross sections of between 0.1 and $1 \times 10^{-14}$ cm$^2$ [20] free holes are likely to be trapped by both of these centers (process 32) where they can be excited back into the valence band by another photon absorption process 31. The D-center has a much smaller electron capture cross section as revealed by D-center photoluminescence glow times of one minute at low-temperature [19]. Consequently, it is unlikely that a photoionized electron will be recaptured. The result is persistent photoconductivity (PPC), as illustrated in FIG. 9 (c). When the source of electromagnetic radiation is removed, remaining holes in the optically active material are trapped by the D-center and the B acceptors through process 32. The non-equilibrium free electrons remain in the conduction band until either they are captured by the D-center (process not shown) through a characteristic emission of a broad band of photons centered at about 2.13 eV in 6H [20] (or 2.34 eV in 4H [21]) or they recombine with a hole that is thermally emitted by the D-center (process 33 followed by process 34). The combination of processes 33 and 34 is known to occur and is called thermal quenching [19]. However, the time constant of the process is governed by the relatively slow thermal emission of holes from the D-center, which has been observed in numerous reports to occur on a time scale of about 10 ms at 300 K (e.g., [20] and [22]). Persistent photoconductivity of this duration is about 1000 times longer than that observed in GaAs:Cu:Si [10], and thus represents a significant improvement over the prior art.

Persistent photoconductivity can be optically quenched as shown in FIG. 9 (d), when electromagnetic radiation with a wavelength less than 1.77 µm but greater than 0.58 µm illuminates the optically active material. Photons in this energy range (0.7<hv<2.13 eV) excite process 35 but not process 30. This means that holes that were being thermally emitted at a very slow rate by process 33 will now be emitted at a rate determined by the much greater rate of process 35. Assuming the recombination process 34 is of a comparable rate as hole capture by process 32, then quenching of the PPC will occur. If the recombination process is significantly slower than hole capture, then optical quenching will not be observed. Therefore, the present invention includes an optically active material with an electron-hole recombination rate comparable to or faster than that of the hole capture process 32. In that case the material will be returned to the state shown in FIG. 9 (e), which is substantially similar to the initial state shown in FIG. 9 (a).

Figure 10:
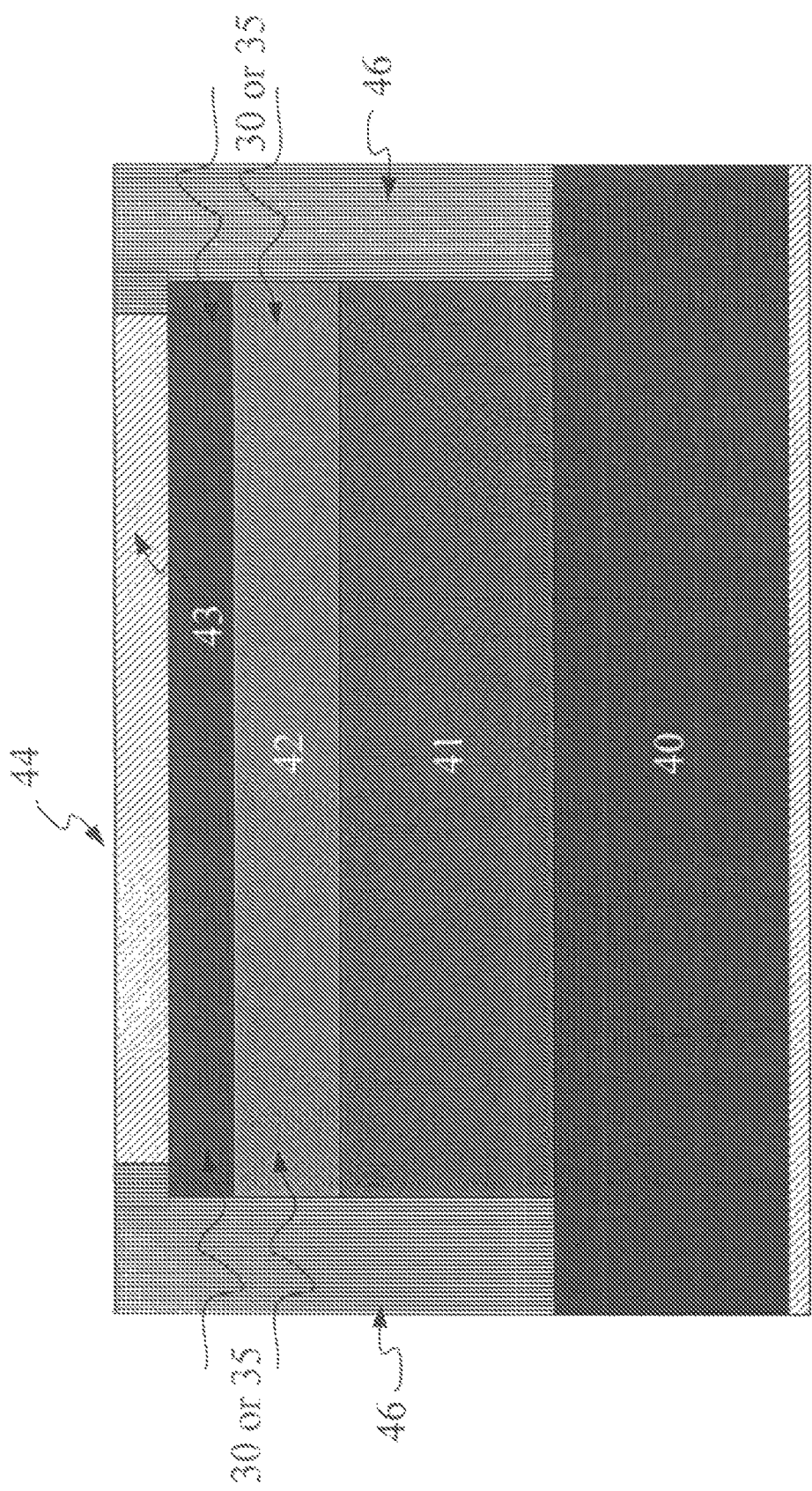
FIG. 10 is a cross-sectional view of a vertical planar bipolar junction transistor (BJT) containing an optically active region of SiC:B:N illuminated from the ends in accordance with an embodiment of the present invention.

FIG. 10 is an illustration of the cross section of one embodiment of this invention comprising a bipolar junction transistor (BJT) with an optically active region. The device is fabricated on an n-type conducting substrate 40. Upon the substrate is grown epitaxially an n-type collector 41 of sufficient thickness and doping to block the required voltage while the device is in the off state. Upon this collector is fabricated an optically active region of semiconductor 42 that acts as the base of the BJT. Methods for fabricating such an optically active material can be fabricated by compensating an epitaxial layer containing a certain concentration of shallow donors by introducing boron in a way that forms D-centers as disclosed in U.S. Patent Application 2002/0149021 A1 [23]. The layer 42 is sufficiently compensated with boron acceptors and D-centers to become highly resistive and p-type in conductivity. An n-type emitter layer 43 is added on top of layer 42 either by epitaxial means or by ion implantation. This embodiment is especially compatible with the deep mesa edge termination technique which is shown in FIG. 10 with a sidewall passivating dielectric material 46 applied Ohmic contact to the emitter layer is formed by a suitable sequence of metal layers and heat treatments leaving a metal stack 44 as the emitter contact. A similar process is applied to the bottom of the substrate 40 leaving a metal stack 45 as the collector contact. Light of one wavelength or the other is introduced at the edges of the device. As the light propagates through the device from one or more sides, processes 30 or 35 occur in the optically active region 42 which can change the conductivity of this material in a way that changes the switch state of the device. In the case of electromagnetic radiation with a wavelength that produces process 30 the device state is changed from non-conducting ("blocking") to conducting ("on"). In the case of electromagnetic radiation with a wavelength that produces process 35 only, the device state is changed from conducting ("on") to non-conducting ("blocking").

The ability to activate the entire volume of optically active material in a power device of significant dimension is a significant advantage of this invention. The wavelengths of the electromagnetic radiation disclosed in the physical description of the photoconductivity cycle in FIG. 9 are known as sub-bandgap wavelengths because the photon energy of the radiation is less than the bandgap of the semiconductor. Therefore, the radiation is much more weakly absorbed than in the case of above-bandgap wavelengths. The formula for the characteristic penetration of electromagnetic radiation into a material is given by Eq. (1):

$$I(x) = I_0 \exp(-\alpha x) \tag{1}$$

where I(x) is the intensity of the radiation in units of W/cm$^2$ at a point x inside of the optically active material 42, $I_0$ is the initial intensity of the radiation at the surface of the BJT where the radiation is introduced into the device (x=0), and α is the absorption coefficient of the radiation at the specified wavelength in units of cm$^{-1}$. For sub-bandgap radiation, the absorption coefficient is determined by photoionization of deep levels, like the D-center. An approximation to the absorption coefficient is given by Eq. (2):

$$\alpha = \sigma N_D \tag{2}$$

where σ is the cross section for photoionization in units of cm$^2$ and $N_D$ is the number density of D-centers in units of cm$^{-3}$. It has been reported that α=4.17×10$^{-17}$ cm$^2$ for the boron-related absorption band with a threshold photon energy of 0.7 eV [24], which is the D-center. The characteristic absorption depth of the sub-bandgap electromagnetic radiation is $$d = 1/\alpha. \tag{3}$$

The embodiment of FIG. 10, in which the electromagnetic radiation is propagated through the length of the device, requires that d be comparable to the lateral dimensions of the device so that the photons are absorbed efficiently and uniformly throughout the optically active material. Such a large distance means the SiC is nearly transparent to sub-bandgap wavelengths. Typically, it is preferable for d>1 mm, which means $N_D<10^{17}$ cm$^{-3}$.

Understanding the teachings of this disclosure requires more than simply considering the photoconductive cycle shown in FIG. 9 and the teachings presented in '061 by Schoenbach. The incorporation of an optically active material into a practical semiconductor device of the type shown in FIG. 10 is not taught in the prior art and is a non-obvious improvement.

Figure 11:
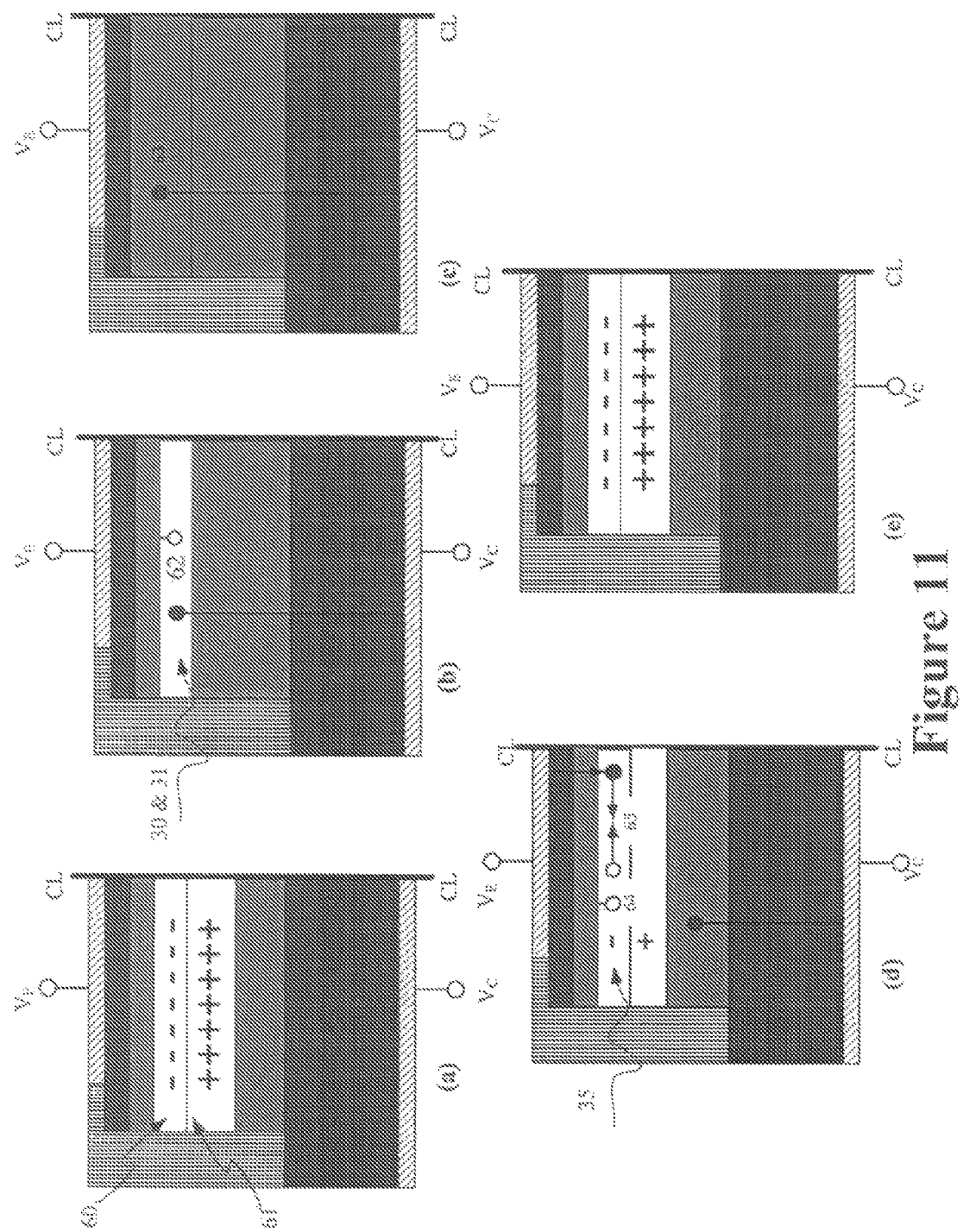
FIG. 11 is an illustration of the cycle of charge control possible in an optically active material made from SiC:B:N compensated with D-centers when laser pulses of two different wavelengths consecutively illuminate the optically active region of the bipolar junction transistor illustrated in FIG. 10.

FIG. 11 (a) illustrates one-half of a BJT of the embodiment shown in FIG. 10. The BJT is shown with a voltage $V_C$ applied to the collector contact and a voltage $V_E$ applied to the emitter contact, where $V_C>V_E$. The optically active material is in the quasi-equilibrium state illustrated by FIG. 9 (a) and will thus be partially depleted of free holes, leaving a region of negative space charge 60. Likewise, the n-type material in contact with the optically active material at the metallurgical junction formed between the two materials is partially depleted of free electrons, leaving a region of positive space charge 61. The BJT in this state will allow only a small leakage current to flow upon application of a differential voltage $V_{CE}=V_C-V_E$ up to the dielectric breakdown strength of the device.

FIG. 11 (b) illustrates the change in the device caused by illumination by electromagnetic radiation with wavelength short enough to excite the photoionization processes 30 and 31. The net result is the creation of significant densities of free electrons and free holes in the optically active material. These free carriers separate in the electric field generating an electrical current 62 by drift and diffusion. Electrons and holes that drift to the collector and emitter contacts, respectively, are replaced by new photoionization events in the optically active material. This gives rise to a much larger current flowing from collector to emitter than existed while the devices was in the blocking state shown in FIG. 11 (a). Since the process of photo absorption is among the fastest known to modern physics, the change of the BJT from the blocking state to the conducting state can occur over the time scale of the pulse of electromagnetic radiation, which can easily be nothing more than nanoseconds in duration.

Eventually, the pulse of electromagnetic radiation subsides and the remaining free holes are trapped (process 32 in FIG. 9 (b)) into boron acceptors and D-centers. The result is that the optically active material has been optically converted from an equilibrium p-type material to the non-equilibrium n-type material illustrated in FIG. 11 (c). The optically active material now acts like a p-base of a BJT in which the holes are immobile (as indeed they are because they have been trapped in the hole traps) so that they cannot be injected into the emitter and they cannot recombine with the electrons injected from the emitter 63. The loss of injected electrons is determined by the rate of the hole-emission process 33 in FIG. 9 (c). Since that rate is very low for the D-center, the device remains in the non-equilibrium state of FIG. 11 (c) for some 10 ms at T=300 K, and while in that state it acts as a very high-gain BJT for which currently there is no conventional equivalent in SiC. For conducting current longer than 10 ms, a second pulse of electromagnetic radiation with wavelength sufficiently short to induce processes 30 and 31 can be applied as often as necessary to satisfy the desired conduction period.

The persistence of the non-equilibrium conducting state shown in FIG. 11 (c) can be terminated on command at anytime by illuminating the device with electromagnetic radiation with a wavelength sufficient to induce process 35 in the optically active material as shown in FIG. 11 (d). This process produces only free holes, which largely participate in one of three processes while in the valence band. One process is to be recaptured as in process 32 of FIG. 9 (b). A second is process 64 in which the photoionized hole drifts and/or diffuses to the emitter layer, which leaves behind a quanta of negative space charge. A third is process 65 in which a photoionized hole recombines with a free electron, either spontaneously or with the assistance of a recombination center in the bandgap of the SiC. The latter is typically much faster in an indirect semiconductor like SiC and thus can be expected to dominate. In this way, minority carrier charge in the form of electrons is rapidly depleted from the optically active material leaving a negative space charge region 60. Likewise, the drift and/or diffusion of a free electron to the collector contact in the n-type material (process 66) that is not replaced from the optically active material leaves behind a quanta of positive charge; and in this way the n-type material adjacent to the junction is simultaneously and rapidly depleted of free electrons leaving behind a positive space charge region 61. Consequently, the device is returned to the blocking state shown in FIG. 11(e).

The embodiment shown in FIG. 10 has many advantages, including the simplicity of manufacturing the semiconductor device and the large ratio of the active area to the physical area of the device. One disadvantage is the problem of propagating light efficiently and uniformly from the edges of the device throughout the volume of optically active material.

Figure 12:
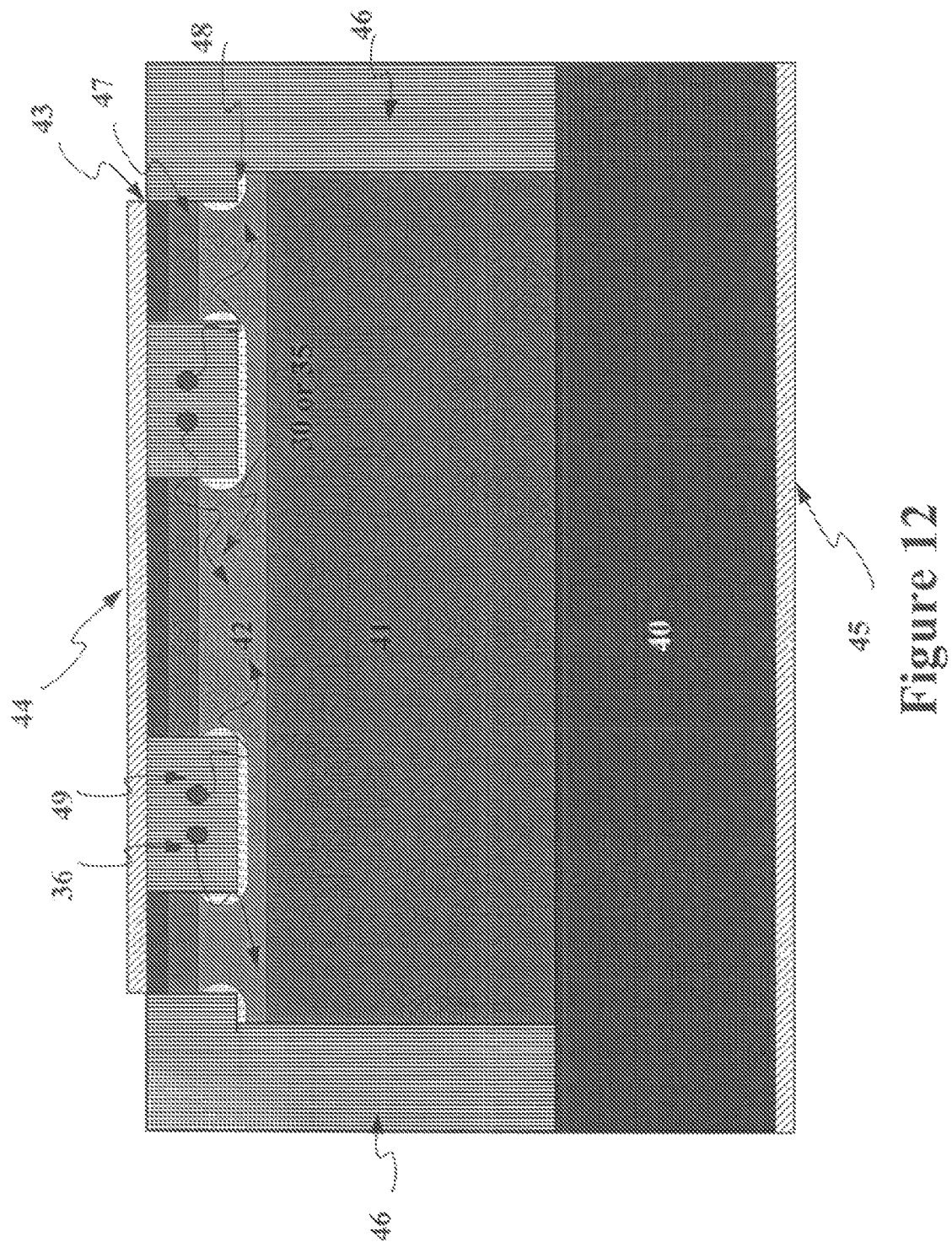
FIG. 12 is a cross-sectional view of a vertical trench bipolar junction transistor (BJT) containing an optically active region of SiC:B:N illuminated from the ends through lossy waveguides fabricated in the trenches in accordance with an embodiment of the present invention.

The embodiment shown in FIG. 12 offers an improvement in this respect. This device is also a BJT, but with a trenched cross section instead of a planar cross section. The device is formed on a conducting n-type substrate 40 by epitaxially growing an n-type drift layer 41. An n-type channel layer 47 is grown over the drift layer 41 followed by an emitter layer 43 that is grown or implanted onto or into, respectively, the channel layer. Trenches are formed such that their depth exceeds the thickness of the emitter layer 43. Boron is implanted into the trenches while prevented from being implanted into the emitter layer by a suitable masking material, and thus representing a self-aligned process. Such an embodiment also incorporates teachings found in the specification and claims of U.S. Pat. No. 6,767,783 [25]. The boron implanted region 48 represents a solid source of boron selectively placed into the trench structure. An additional thermal process step of sufficient temperature will cause boron to diffuse into the channel layer and introduce boron acceptors and D-centers, thus selectively producing a region of p-type optically active material 42. The trenches are filled with a combination of dielectric materials 49 that serve two purposes. First, the dielectric materials provide surface passivation and electrical insulation of the emitter base junction formed between the emitter layer and the p-type optically active material. The dielectric stack also forms a lossy waveguide of electromagnetic radiation at optical frequencies, including the infrared band and the visible band. To finish the device, an edge termination structure is formed, such as the deep mesa with dielectric passivation structure 46 illustrated. Ohmic metal contacts are added to form the emitter contact 44 and the collector contact 45.

As shown in FIG. 12, when beams of electromagnetic radiation 36 are launched down the trenches from one or both ends of the device, some of the radiation scatters into the optically active material on either side of the trench, producing processes 30 and 31 or process 35 depending on the wavelength of the radiation. The BJT is switched from the non-conducting state to the conducting state and back to the non-conducting state in a sequence essentially identical to that shown in FIG. 11. The width of the channel fingers can be optimally chosen by those skilled in the art to fall in a range from one micrometer to many micrometers, depending on the channel doping and the absorption length of the electromagnetic radiation.

Figure 13:
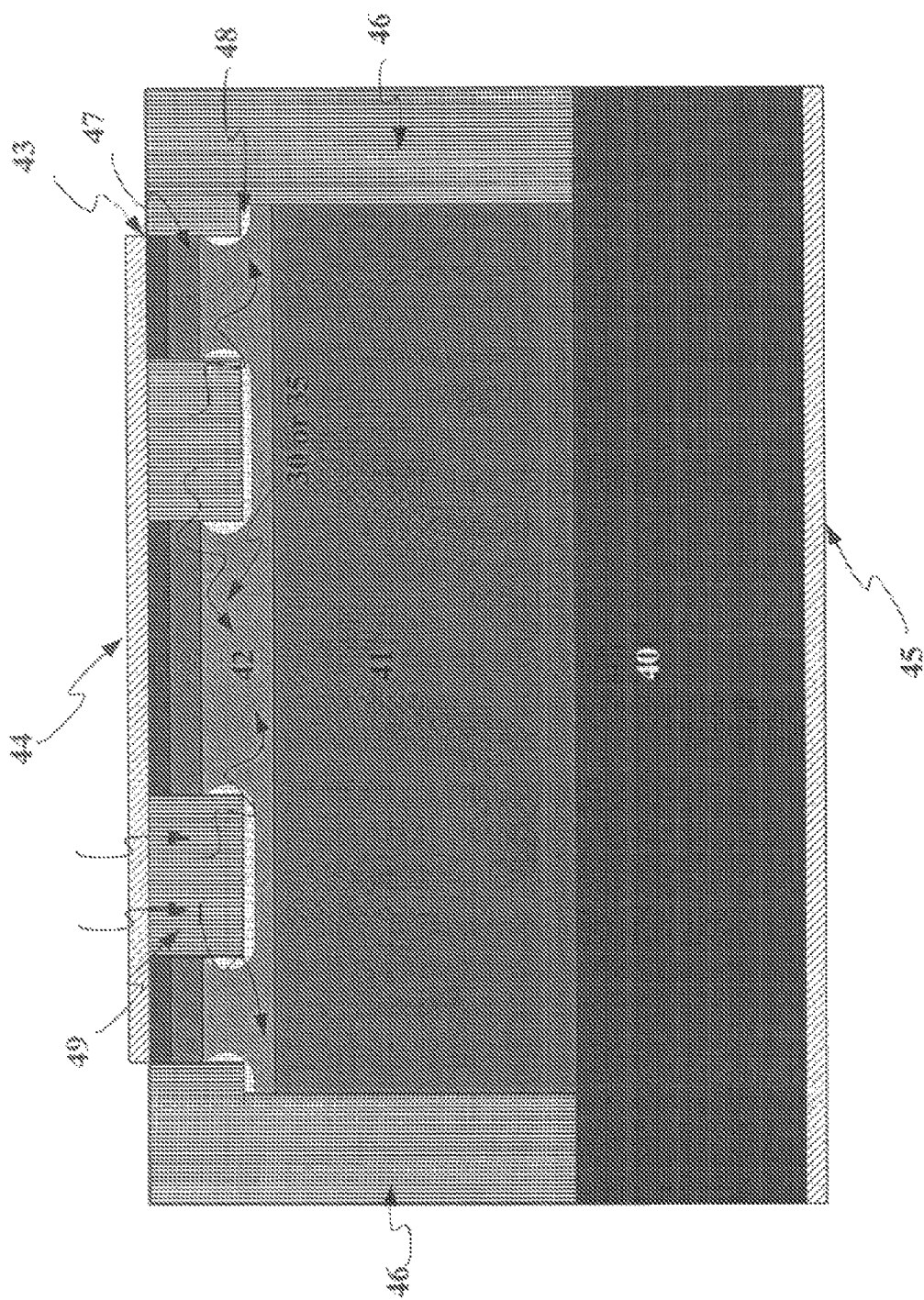
FIG. 13 is a cross-sectional view of a vertical trench bipolar junction transistor (BJT) containing an optically active region of SiC:B:N illuminated from the top into lossy waveguides fabricated in the trenches in accordance with an embodiment of the present invention.

Both of the embodiments shown in FIG. 10 and FIG. 12 still require the electromagnetic radiation to be introduced from the edges of the device, which increases the complexity of the interface between the device and the source of the electromagnetic radiation. FIG. 13 is yet another embodiment of the invention that is a BJT substantially similar to the embodiment shown in FIG. 12 except that the emitter contact 44 has openings fanned such that electromagnetic radiation can be launched into the waveguide 49 from the top of the device. The radiation is again scattered into the optically active material 42 as with the embodiment shown in FIG. 12. This, and all embodiments that are excited with electromagnetic radiation from the top, are highly compatible with many different edge termination techniques in addition to the deep mesa technique shown in FIG. 13, including (but not limited to) raised and buried guard rings and the junction termination extension (JTE) in its many forms.

Figure 14:
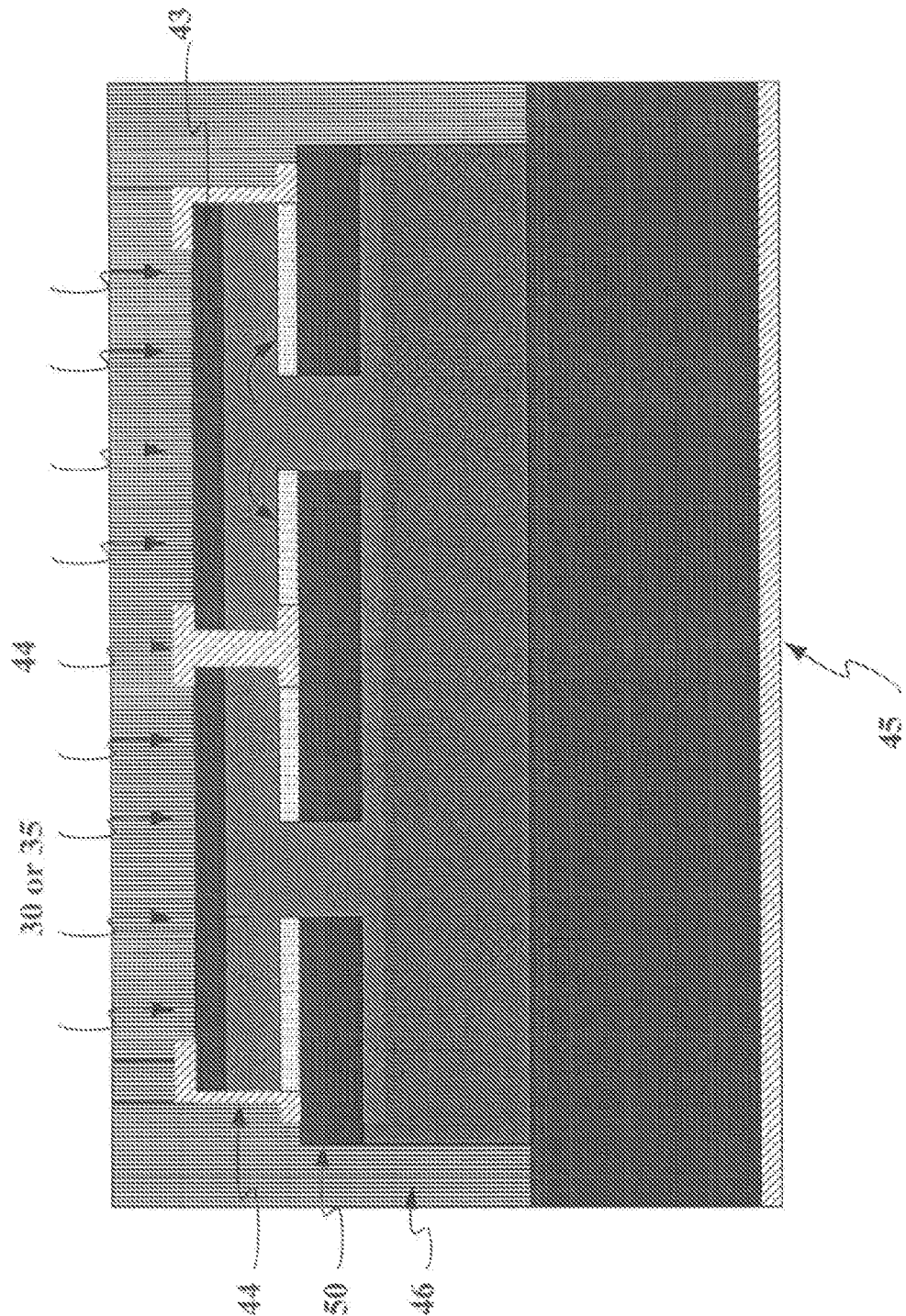
FIG. 14 is a cross-sectional view of a vertical channel junction field effect transistor (JFET) containing an optically active region of SiC:B:N illuminated directly from the top in accordance with an embodiment of the present invention.

Yet another embodiment modifies the BJT device structure to add a junction field effect transistor (JFET) structure as shown in FIG. 14. The device is formed of a conducting substrate 40 and an n-type drift layer 41 as in previous devices. A layer of strongly p-type material 50 is added using a dopant other than boron, such as aluminum. The layer can be formed either by epitaxial means or by implantation. A boron implant 48 is added to the surface of the p-type layer 50. Trenches are formed through the p-type layer and a channel is regrown using epitaxial means to fill the trenches and cover the p-type layer and the boron implant using methods that leave a substantially planar surface. On top of the channel a heavily doped n-type layer 43 is also grown. Such an embodiment also incorporates teachings found in the specification and claims of [26]. During this regrowth, boron diffuses into the growing channel forming boron acceptors and D-centers and converting the channel into a p-type optically active material 42. Ohmic metal is added to the top of the source layer 43 and the bottom of the substrate 40 to form source contact 44 and drain contact 45, respectively. The source contact is patterned by photolithographic means to open windows to allow electromagnetic radiation to pass through the source layer 43 and stimulate in the optically active material 42 processes 30 and 31 or process 35, depending on the wavelength of the radiation. This causes the device to switch from a non-conducting state to a conducting state and back to a non-conducting state similarly to that shown in FIG. 11. The source contact 44 also makes electrical contact with the p-type layer 50 to ensure that the potential between the source and this p-type layer is zero.

Figure 15:
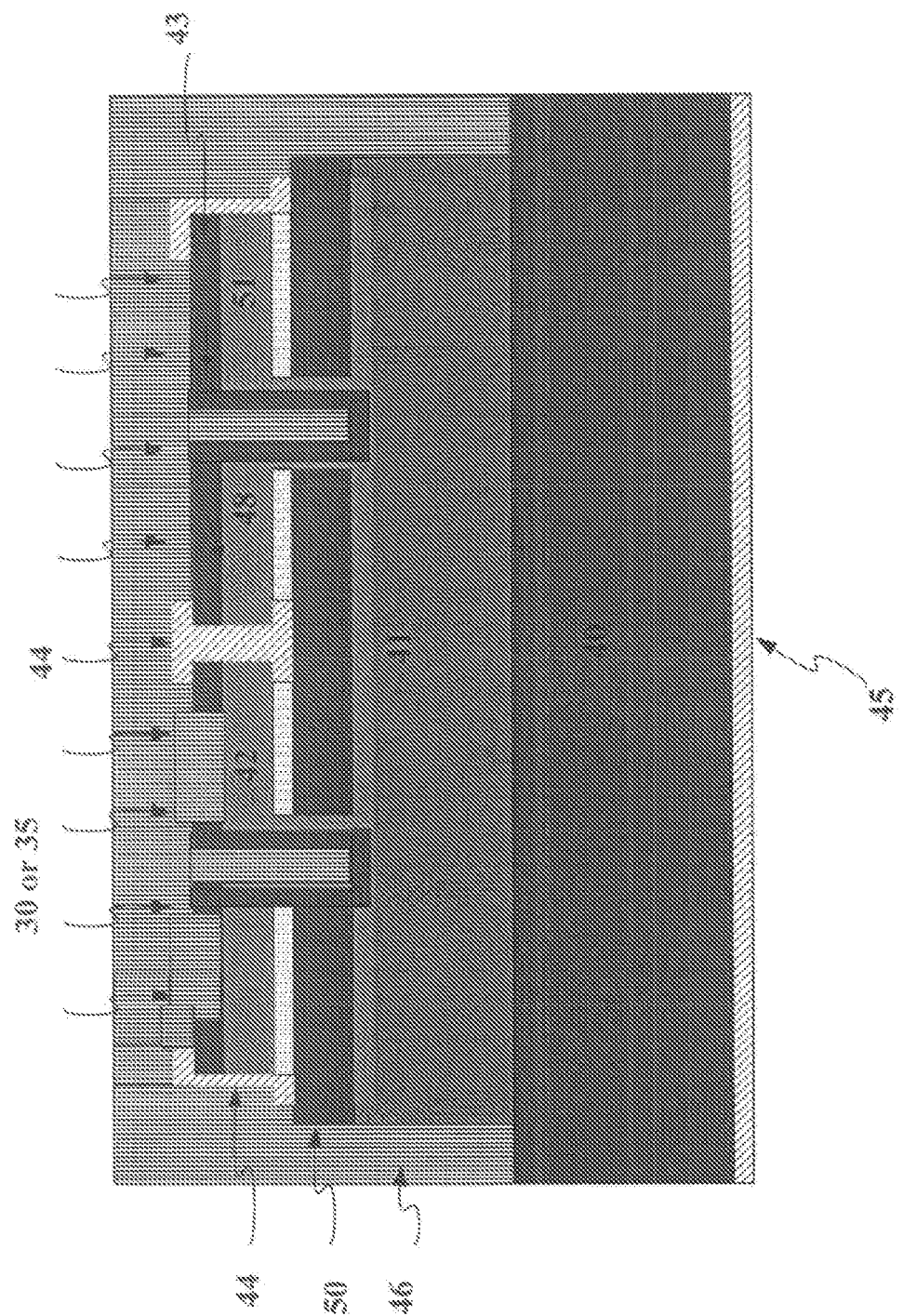
FIG. 15 is a cross-sectional view of a lateral channel metal-oxide-semiconductor field effect transistor (MOSFET) containing an optically active region of SiC:B:N illuminated directly from the top in accordance with an embodiment of the present invention.

It may be desirable in some applications for the depleted portion of the semiconductor device at the boundary of the drift region and the optically active material to not be significantly illuminated by electromagnetic radiation. In FIG. 15 yet another embodiment is illustrated in which the JFET channel region is shorted by a heavily n-type material 51. The conduction of current through the device is thus controlled solely by the conducting state of the optically active material 42 at the surface of the device. In this embodiment, a window is opened in both the source contact 44 and the source layer 43. The surface of the channel between the source material 43 and the channel layer 51 is in contact with the dielectric passivation material 46. This embodiment is similar to an un-gated metal-oxide semiconductor field effect transistor (MOSFET). The window through the source contact and the source material allow the optically active material to be stimulated by electromagnetic radiation from the top and thus the device operates similar to the embodiment shown in FIG. 14.

An important consideration for determining whether the present invention has practical application is the amount of energy in each pulse of electromagnetic radiation required to cause the device to change conducting state. A kinematic approach is taken to estimate a figure of merit, which is the optical energy per ampere of current required.

The energy per unit area is given by Eq. (4):

$$E/A = \eta q h\nu N_D \quad (4),$$

where E/A is energy per unit area in each pulse of electromagnetic radiation in units of J/cm$^2$, $\eta$ is the dimensionless multiplication factor required to address various inefficiencies of optical excitation, q is the elementary charge=1.60× 10$^{-19}$ C, hv is the energy per photon in units of eV, which for 4H—SiC is estimated to be 2.4 eV, and $N_D$ is the effective maximum number density of electrons in units of cm$^{-3}$ that can be excited into persistent photoconductivity, which is approximately given by the shallow donor density in the optically active material.

The figure of merit is computed by normalizing Eq. (4) with the current density to be conducted by the device while in persistent photoconductivity. The rated current of a typical power device is specified at a forward voltage of 2 V. If the specific on resistance of the device is at about the state of the art for 4H—SiC power JFETs, then $\rho_{(on)}$=2.5 mΩ-cm$^2$ [27]. The expected rated current density for this technology is $$J = V_{(on)}/\rho_{(on)} = 2 \text{ V}/2.5 \text{ mΩ-cm}^2 = 800 \text{ A/cm}^2. \quad (5)$$

By normalizing Eq. (4) with Eq. (5) the figure of merit is written as:

$$(E/A)/J = \eta q h\nu N_D \rho_{(on)}/V_{(on)} \quad (6)$$

For $N_D = 1 \times 10^{16}$ cm$^{-3}$ about the correct value for a 600-V device with $\rho_{(on)}$=2.5 mΩ-cm$^2$, and ignoring $\eta$ for the moment, then (E/A)/J=2 nJ/A. The multiplication factor $\eta$ cannot be less than 2 in a material optimized only for turn on, and if the efficiency is balanced for good turn off performance as well, then the multiplication factor may be as large as 10. The frequency of electromagnetic pulses that must be applied to maintain conduction depends on the thermal hole emission rate, which at room temperature is quite low at 100 s$^{-1}$ [20]. But as the junction temperature increases, so does the rate of hole emission. At T=200° C., the hole emission rate will increase about 10,000 fold and the characteristic hole emission time becomes about 1 μs. Since the repetition frequency of the typical power electronics application is less than 1 MHz, then it can be assumed that in a practical application the time interval between pulses of electromagnetic radiation at working temperature is governed by the hole emission rate. A pulse repetition frequency (PRF) of 1 MHz multiplied by the figure of merit (including an efficiency multiplier of 10) means that the required average power of the source of electromagnetic radiation is about 2 nJ/A×10×10$^6$ Hz=20 mW/A. So, for example, a 100-A 4H—SiC BJT device at 200° C. requires about 2 W of optical power to sustain conduction. This is quite practical, but it is not insignificant.

Figure 7:
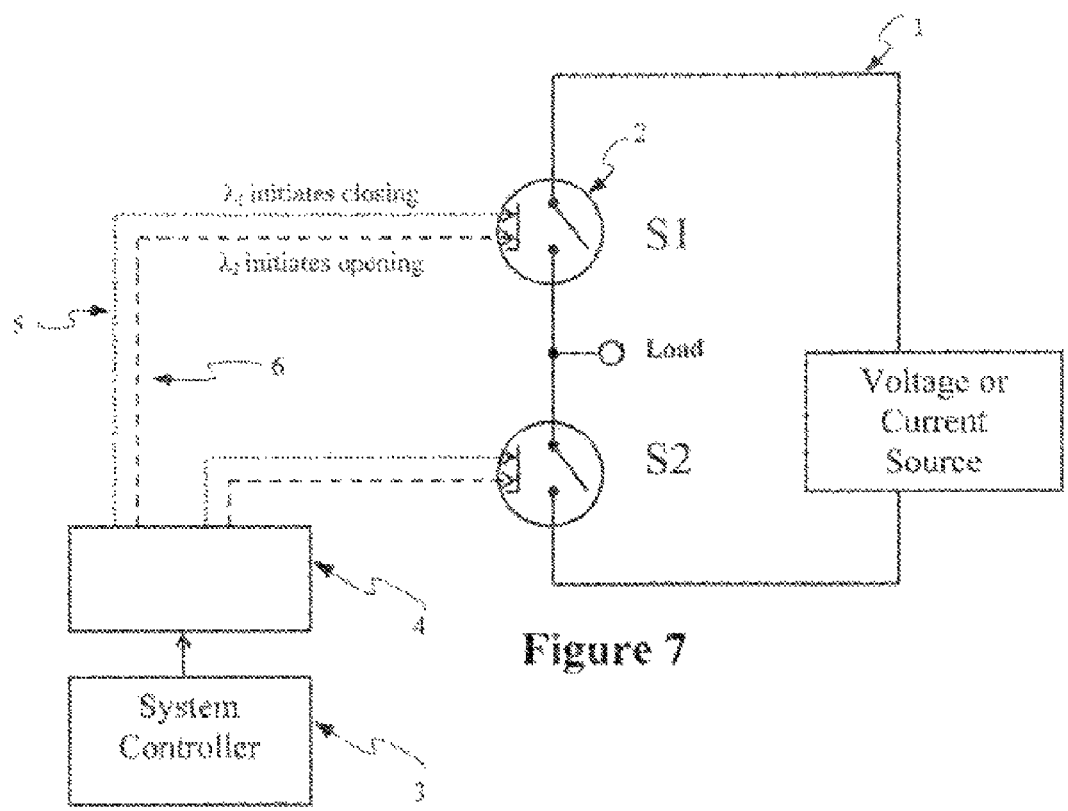
FIG. 7 is an illustration of the application of one or more embodiments of the present invention in a half-bridge circuit.

Another approach to achieve insertion into an application with the same functionality as shown in FIG. 7 is to pair a small-scale version of a device with the embodiment of this invention and a full-scale power device of conventional construction. Such a full scale conventional device might be made from silicon carbide, or it might be made from silicon, or yet another material among the many semiconductors. If such a conventional device were a normally off device (a so-called "enhancement mode" device), then the circuit shown in FIG. 16 represents another embodiment of the invention because if the components revealed in FIG. 16 are packaged together, then a device results that is essentially indistinguishable from a monolithic embodiment of the invention as revealed in FIGS. 10, 12, 13, 14, and 15.

Figure 16:
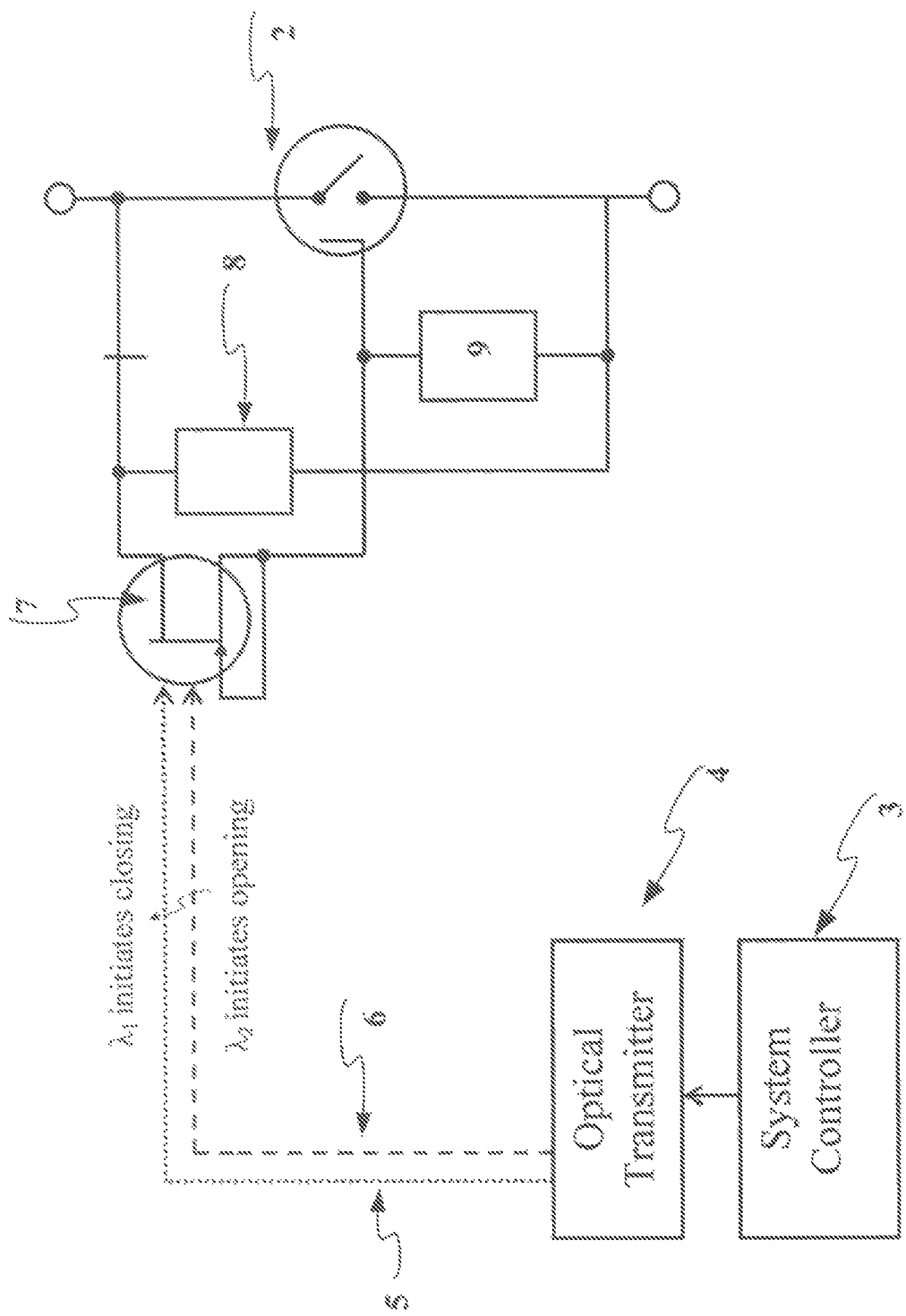
FIG. 16 is an embodiment of the current invention in which the optically active device shown in FIG. 14 is used to drive the gate of a conventional electrically gated power device.

In FIG. 16, the power device of conventional construction 2 can be a BJT, an enhancement-mode MOSFET, a normally off JFET, or a gate turn-off (GTO) thyristor, or any other similar power device. When a pulse of electromagnetic radiation 5 illuminates an optically controlled JFET 7 of similar construction as shown in FIG. 14, it switches positive gate bias to the power device 2 from an energy storage network 8 consisting of an element that stores electrical charge and an element that permits the flow of current in only one direction, such as a diode. The diode allows the electrical storage device to be charged by the source of voltage being switched by the power device 2, but not to be discharged by the power device. The network 9 that is connected between the gate and common terminal of the power device performs two functions. First, it limits the voltage that can be applied to the gate with respect to the common terminal to a safe value. In this function it is assisted by the optically controlled JFET 7 which is capable of self-limiting the current to the network 9 even when the voltage across the charge storage element in network 8 is as large as the rated blocking voltage of the power device 2. Second, it maintains a path for the charge stored in the power device to be discharged from the gate to the common terminal of the power device. One example of a network 9 is one formed by a voltage limiting diode, known as a Zener diode, connected in parallel with a resistor. Alternatively, the resistor can be replaced with a device that acts like a current source, such as a JFET with gate and source terminals shorted together. When a pulse of different wavelength 6 illuminates the optically controlled JFET 7 then the JFET turns off and the gate of the power device 2 is discharged by the network 9 causing the power device to turn off. As shown in FIG. 16, the controller 3 is able to control the conventional power device with an optical transmitter 4 in the same way as shown in FIG. 7; albeit with an advantageous reduction in the optical energy required.

The gain from the embodiment shown in FIG. 16 can be estimated by considering the reduction in the size of the optically controlled device with respect to that of the full-scale power device. A figure of merit that describes the power handling capability of a power switching device is the product of the on-resistance of the device $R_{(on)}$ and the gate charge $Q_G$ required to switch the device into conduction down to $R_{(on)}$. The best SiC power JFET devices have an $R_{(on)} Q_G$ product equal to about $5 \times 10^{-9}$ ΩC at 200° C. The rated drain current of the power device is $I_D = V_{(on)}/R_{(on)}$. The average gate current that must be supplied by the optically controlled device is $1_G = PRF \times Q_G$. Therefore, $$R_{(on)} Q_G = (V_{(on)}/PRF) \times (I_G/I_D) \quad (7),$$

where the optical gain is equal to the reciprocal of the ratio of the area of the optically controlled device to that of an equivalent optically controlled device equal in size to the conventional power device, which is equal to the ratio $I_G/I_D$. Solving (7) for $I_G/I_D$ and assuming $V_{(on)} = 2$ V and PRF=1 MHz then $I_G/I_D = 0.0025$. The optical gain is the reciprocal of this ratio which is 400. If in the previous example the embodiment shown in FIG. 16 is used, then to switch the same 100 A at 200° C. the required optical power is reduced by a factor of 400 to 5 mW. Appropriate sources of pulsed electromagnetic radiation capable of supplying average power of this magnitude are easily available and relatively inexpensive.

Example embodiments of the present invention have now been described in accordance with the above advantages. It will be appreciated that these examples are merely illustrative of the invention. Many variations and modifications will be apparent to those skilled in the art.

Furthermore, the purpose of the Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way.

REFERENCE

[1] Philip Krein, "Chapter 1: Introduction," *Power Electronics Handbook*, ed. M. H. Rashid. Academic Press, San Diego, Calif., 2001, pp. 7-8.

[2] Philip Krein, "Chapter 1: Introduction," *Power Electronics Handbook*, ed. M. F L Rashid. Academic Press, San Diego, Calif., 2001, p. 10.

[3] Jerry Hudgins, Enrico Santi, Antonio Caiafa, Katherine Lengel, and Patrick R. Palmer, "Chapter 3: Thyristors," *Power Electronics Handbook*, ed. M. H. Rashid. Academic Press, San Diego, Calif., 2001, p. 44.

[4] J. Wilson and J. F. B. Hawkes, *Optoelectronics: An Introduction*. Prentice-Hall international, London, 1983, pp. 323-324.

[5] M. Buttram, "Chapter 1: Introduction," *High-Power Optically Activated Solid-State Switches*, eds. A. Rosen and F. Zutavern. Artech House, Norwood, Mass., 1994, p. 2.

[6] M. D. Pocha and W. W. Hofer, "Chapter 3: *High-Speed Switching in Photoconductors,*" *High-Power Optically Activated Solid-State Switches*, eds. A. Rosen and F. Zutavern. Artech House, Norwood, Mass., 1994, p. 48.

[7] Fred J. Zutavern and Guillermo M. Loubriel, "Chapter 11: High-Voltage Lateral Switches From Silicon or Gallium Arsenide," *High-Power Optically Activated Solid-State Switches*, eds. A. Rosen and F. Zutavern. Artech House, Norwood, Mass., 1994, pp. 247-251.

[8] K. H. Schoenbach, "Chapter 6: Optically Activated Opening of Copper-Doped Gallium Arsenide Switches," *High-Power Optically Activated Solid-State Switches*, eds. A. Rosen and F. Zutavern. Artech House, Norwood, Mass., 1994, p. 95.

[9] Karl H. Schoenbach, Rudolf K. F. Germer, Vishnukumar K. Lakdawala, Sacharia Albin, "Optically Controlled Bulk Semiconductor Switch Not Requiring Radiation to Sustain Conduction," U.S. Pat. No. 4,825,061, April 1989.

[10] M. S. Mazzola, K. H. Schoenbach, V. K. Lakdawala, R. Germer, G. M. Loubriel, and F. J. Zutavern, "GaAs Photoconductive Closing Switches with High Dark Resistance and Microsecond Conductivity Decay," *Appl. Phys. Lett.*, vol. 54, pp. 742-744, 1989.

[11] M. S. Mazzola, K. H. Schoenbach, V. K. Lakdawala, and S. T. Ko, "Nanosecond Optical Quenching of Photoconductivity in a Bulk GaAs Switch," *Appl. Phys. Lett.*, vol. 55, pp. 2102-2104, 1989.

[12] Joseph Blanc, Richard H. Bube, and Harold E. MacDonald, "Properties of High-Resistivity Gallium Arsenide Compensated with Diffused Copper, *J. Appl. Phys.*, vol. 32, pp. 1666-1679, 1961.

[13] Jose Saura and Richard H. Bube, "Laser-Quenching of Photoconductivity and Recombination Processes in Sensitive Photoconductors," *J. Appl. Phys.*, vol. 36, pp. 3660-3662, 1965.

[14] Michael S. Mazzola, Karl H. Schoenbach, Vishnu K. Lakdawala, and Randy Roush, "Infrared Quenching of Conductivity at High Electric Fields in a Bulk Copper-Compensated, Optically Activated GaAs Switch," *IEEE Trans. Electron Dev.*, vol. 37, pp. 2499-2505, 1990.

[15] David C. Stoudt, Randy A. Roush, Michael S. Mazzola, and Scott F. Griffiths, "Investigation of a Laser-Controlled, Copper-Doped GaAs Closing and Opening Switch," Proc. *IEEE Pulsed Power Conf.*, pp. 41-44, 1991.

[16] David C. Stoudt and Michael A. Richardson, "Bistable Photoconductive Switches Particularly Suited For Frequency-Agile, Radio-Frequency Sources," U.S. Pat. No. 5,864,166, January 1999.

[17] Randy A. Roush, David C. Stoudt, and Michael S. Mazzola, "Compensation of Shallow Silicon Donors by Deep Copper Acceptors in Gallium Arsenide," *Appl. Phys. Lett.*, vol. 62, pp. 2670-2672, 1993.

[18] Michael S. Mazzola, Randy A. Roush, David C. Stoudt; and Scott F. Griffiths, "Analysis of Nonohmic Current-Voltage Characteristics in a Cu-Compensated GaAs Photoconductor," Appl. Phys. Lett., vol. 59, pp. 1182-1184, 1991.

[19] Stephen E. Saddow, C. Wesley Tipton, and Michael S. Mazzola, "Hole Capture by D-center Defects in 6H-Silicon Carbide," *J. Appl. Phys.*, vol. 77, pp. 318-322, 1995.

[20] W. Suttrop, G. Pensl, and P. Lanig, "Boron-Related Deep Centers in 6H—SiC," *Appl. Phys. A*, vol. 51, pp. 231-237, 1990.

[21] Hrishikesh Das, "The Creation of Boron Deep Levels by High Temperature Annealing of 4H—SiC," Thesis, Master of Science in Electrical Engineering, Mississippi State University, pp. 45-46, 2004.

[22] Michael S. Mazzola, Stephen E. Saddow, Philip G. Neudeck, V. K. Lakdawala, and Susan We, "Observation of the D-Center in 6H—SiC p-n Diodes Grown by Chemical Vapor Deposition," *Appl. Phys. Lett.*, vol. 64, pp. 2370-2372, 1994.

[23] Jeffrey B. Casady and Michael S. Mazzola, U.S. Patent Application Publication 2002/0149021 A1, October 2002.

[24] J. R. Jenny, M. Skowronski, W. C. Mitchel, H. M. Hobgood, R. C. Glass, G. Augustine, and R. H. Hopkins, "Optical and Electrical Characterization of Boron Impurities in Silicon Carbide Grown by Physical Vapor Transport," *J. Appl. Phys.*, vol. 79, pp. 2326-2331, 1996.

[25] Jeffrey B. Casady, Geoffrey E. Carter, Yaroslav Koshka, Michael S. Mazzola, Igor Sankin, "Self-Aligned Transistor and Diode Toplogies in Silicon Carbide Through The Use of Selective Epitaxy or Selective Implantation," U.S. Pat. No. 6,767,783, July 2004.

[26] Lin Cheng and Michael S. Mazzola, "Vertical Channel Junction Field-Effect Transistors Having Buried Gates and Methods of Making," U.S. Patent application Ser. No. 11/198,298, filed Aug. 8, 2005, published as U.S. Patent Application Publication No. 2007/0029573 A1.

[27] Lin Cheng, Janna Casady, Michael Mazzola, Igor Sankin, Joseph Merrett, Volodymyr Bondarenko, Robin Kelley, Jeffery Casady, "Fast Switching (41 MHz), 2.5 mΩ·cm², High Current 4H—SiC VJFETs for High Power and High Temperature Applications," presented at Inter. Conf. Silicon Carbide and Related Mat. (ICSCRM), Pittsburgh, Pa., 2005.

What is claimed is:

1. A device comprising:
    a substrate;
    an optically active, semi-insulating silicon carbide (SiC) layer applied over the substrate, the SiC layer having boron-related D-center defects formed therein; and
    an electromagnetic radiation source, the electromagnetic radiation source in optical communication with the SiC layer such that electromagnetic radiation produced by the electromagnetic radiation source is directed onto a surface of the SiC layer;
    wherein the electromagnetic radiation source produces electromagnetic radiation having at least a first wavelength that stimulates photoconductivity in the SiC layer and a second wavelength that quenches photoconductivity in the SiC layer.

2. The device of claim 1, wherein the substrate is a N-type conducting substrate.

3. The device of claim 1, wherein the substrate is a P-type conducting substrate.

4. The device of claim 1, further comprising:
    a controller connected to the electromagnetic radiation source, the controller driving the electromagnetic radiation source to deliver a pulse of electromagnetic radiation of the first or second wavelength to the optically active, semi-insulating silicon carbide (SiC) layer such that the device changes from a conducting to a non-conducting state or from a non-conducting to a conducting state.

5. The device of claim 1, wherein the device is configured as an optically controlled bi-polar junction transistor (BJT).

6. The device of claim 1, wherein the device is an optically controlled junction transistor field effect transistor (JFET).

7. The device of claim 1, wherein the device is configured as an optically controlled metal oxide semiconductor field effect transistor (MOSFET).

8. The device of claim 1, wherein the device is an optically controlled thyristor.

9. A device comprising:
    a substrate;
    a drift layer disposed on the substrate;
    a channel layer disposed on the drift layer;
    an optically active, semi-insulating silicon carbide (SiC) layer applied over the substrate, the SiC layer having boron-related D-center defects formed therein; and
    an electromagnetic radiation source, the electromagnetic radiation source in optical communication with the SiC layer such that electromagnetic radiation produced by the electromagnetic radiation source is directed onto a surface of the SiC layer;
    wherein the electromagnetic radiation source produces electromagnetic radiation having at least a first wavelength that stimulates photoconductivity in the SiC layer and a second wavelength that quenches photoconductivity in the SiC layer.

10. The device of claim 9, wherein the substrate is a N-type conducting substrate.

11. The device of claim 9, wherein the substrate is a P-type conducting substrate.

12. The device of claim 9, further comprising:
    a controller connected to the electromagnetic radiation source, the controller driving the electromagnetic radiation source to deliver a pulse of electromagnetic radiation of the first or second wavelength to the optically active, semi-insulating silicon carbide (SiC) layer such that the device changes from a conducting to a non-conducting state or from a non-conducting to a conducting state.

13. The device of claim 9, wherein the device is an optically controlled BJT.

14. The device of claim 9, wherein the device is an optically controlled JFET.

15. The device of claim 9, wherein the device is an optically controlled MOSFET.

16. The device of claim 9, wherein the device is an optically controlled thyristor.

17. The device of claim 1, wherein the device further comprises a material which allows electromagnetic radiation to enter the surface of the SiC layer, wherein the electromagnetic radiation source is adapted to direct the electromagnetic radiation onto the surface of the SiC layer through the material.

18. The device of claim 17, wherein the material which allows electromagnetic radiation to enter the surface of the SiC layer is a dielectric material.

19. The device of claim 9, wherein the device further comprises a material which allows electromagnetic radiation to enter the surface of the SiC layer, wherein the electromagnetic radiation source is adapted to direct the electromagnetic radiation onto the surface of the SiC layer through the material.

20. The device of claim 19, wherein the material which allows electromagnetic radiation to enter the surface of the SiC layer is a dielectric material.

* * * * *